(12) United States Patent
Pierrat

(10) Patent No.: US 7,132,203 B2
(45) Date of Patent: Nov. 7, 2006

(54) PHASE SHIFT MASKING FOR COMPLEX PATTERNS WITH PROXIMITY ADJUSTMENTS

(75) Inventor: Christophe Pierrat, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 10/818,727

(22) Filed: Apr. 6, 2004

(65) Prior Publication Data

US 2004/0191650 A1 Sep. 30, 2004

Related U.S. Application Data

(63) Continuation of application No. 10/068,513, filed on Feb. 6, 2002, now Pat. No. 6,733,929, which is a continuation-in-part of application No. 09/932,239, filed on Aug. 17, 2001, which is a continuation-in-part of application No. 09/669,368, filed on Sep. 26, 2000, now Pat. No. 6,524,752.

(60) Provisional application No. 60/304,142, filed on Jul. 10, 2001, provisional application No. 60/296,788, filed on Jun. 8, 2001, provisional application No. 60/215,938, filed on Jul. 5, 2000.

(51) Int. Cl.
*G03F 9/00* (2006.01)

(52) U.S. Cl. .............................. 430/5; 716/19
(58) Field of Classification Search .............. 430/5; 716/19
See application file for complete search history.

(56) References Cited

U.S. PATENT DOCUMENTS

| | | | |
|---|---|---|---|
| 5,302,477 A | 4/1994 | Dao et al. .................. 430/5 |
| 5,308,741 A | 5/1994 | Kemp ..................... 430/312 |
| 5,324,600 A | 6/1994 | Jinbo et al. ................ 430/5 |
| 5,364,716 A | 11/1994 | Nakagawa et al. ........... 430/5 |
| 5,472,814 A | 12/1995 | Lio ......................... 430/5 |
| 5,523,186 A | 6/1996 | Lin et al. .................. 430/5 |
| 5,527,645 A | 6/1996 | Pati et al. .................. 430/5 |
| 5,537,648 A | 7/1996 | Liebmann et al. .......... 395/500 |
| 5,538,815 A | 7/1996 | Oi et al. ................... 430/5 |
| 5,565,286 A | 10/1996 | Lin ......................... 430/5 |
| 5,573,890 A | 11/1996 | Spence .................... 430/311 |
| 5,595,843 A | 1/1997 | Dao ......................... 430/5 |
| 5,620,816 A | 4/1997 | Dao ......................... 430/5 |
| 5,635,316 A | 6/1997 | Dao ......................... 430/5 |
| 5,636,131 A | 6/1997 | Liebmann et al. .......... 364/490 |
| 5,702,848 A | 12/1997 | Spence ...................... 430/5 |
| 5,761,075 A | 6/1998 | Oi et al. .................. 364/488 |
| 5,766,804 A | 6/1998 | Spence ...................... 430/5 |
| 5,766,806 A | 6/1998 | Spence ...................... 430/5 |
| 5,807,649 A | 9/1998 | Liebmann et al. ............ 430/5 |
| 5,811,211 A | 9/1998 | Tanaka et al. |
| 5,858,580 A | 1/1999 | Wang et al. ................. 430/5 |
| 5,923,562 A | 7/1999 | Liebmann et al. .......... 364/488 |
| 5,923,566 A | 7/1999 | Galan et al. .............. 364/489 |
| 5,994,002 A | 11/1999 | Matsuoka ................... 430/5 |
| 5,998,068 A | 12/1999 | Matsuoka ................... 430/5 |
| 6,040,892 A | 3/2000 | Piorrat |
| 6,057,063 A | 5/2000 | Liebmann et al. ............ 430/5 |
| 6,066,180 A | 5/2000 | Kim et al. .................. 716/19 |
| 6,083,275 A | 7/2000 | Heng et al. ................. 716/19 |
| 6,130,012 A | 10/2000 | May et al. .................. 430/5 |
| 6,139,994 A | 10/2000 | Broeke et al. .............. 430/5 |
| 6,185,727 B1 | 2/2001 | Liebmann .................. 716/19 |
| 6,228,539 B1 | 5/2001 | Wang et al. ................. 430/5 |
| 6,251,549 B1 | 6/2001 | Levenson .................. 430/11 |
| 6,258,493 B1 | 7/2001 | Wang et al. ................. 430/5 |
| 6,335,128 B1 | 1/2002 | Cobb et al. ................. 430/5 |
| 6,338,922 B1 | 1/2002 | Liebmann et al. ............ 430/5 |
| 6,420,074 B1 | 7/2002 | Wang et al. ................. 430/5 |
| 6,436,590 B1 | 8/2002 | Wang et al. ................. 430/5 |
| 6,524,752 B1* | 2/2003 | Pierrat ...................... 430/5 |
| 6,733,929 B1* | 5/2004 | Pierrat ...................... 430/5 |
| 2001/0000240 A1 | 4/2001 | Wang et al. ................. 430/5 |
| 2001/0028985 A1 | 10/2001 | Wang et al. ................. 430/5 |
| 2002/0127479 A1 | 9/2002 | Pierrat ...................... 430/5 |

(Continued)

FOREIGN PATENT DOCUMENTS

DE 195 45 163 A1 6/1996

(Continued)

OTHER PUBLICATIONS

Sakata, Miwa, et al., "A Novel Radiation Sensitive Spin-on-glass Convertible into SiO2 and the Simple Fabrication Process Using It," Jul. 26, 1993* (*ATI Bell Labs fax date), 3 pages.

(Continued)

*Primary Examiner*—Christopher G. Young
(74) *Attorney, Agent, or Firm*—Mark A. Haynes; Haynes Beffel & Wolfeld LLP

(57) ABSTRACT

Techniques are provided for extending the use of phase shift techniques to implementation of masks used for complex layouts in the layers of integrated circuits, beyond selected critical dimension features. The method includes identifying features for which phase shifting can be applied, automatically mapping the phase shifting regions for implementation of such features, resolving phase conflicts which might occur according to a given design rule, and application of assist features and proximity correction features. The method includes applying an adjustment to a phase shift mask pattern including a first and a second phase shift window, and a control chrome with a control width, and/or to a trim mask pattern having a trim shape with a trim width based upon one or both of a rule based correction and a model based correction to improve a match between a resulting exposure pattern and a target feature.

34 Claims, 27 Drawing Sheets
(8 of 27 Drawing Sheet(s) Filed in Color)

U.S. PATENT DOCUMENTS

| | | | |
|---|---|---|---|
| 2002/0129327 A1 | 9/2002 | Pierrat et al. | 716/19 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| EP | 0 653 679 A2 | 5/1995 |
| GB | 2333613 A | 7/1999 |
| JP | 62067547 | 3/1987 |
| JP | 2-140743 | 5/1990 |
| JP | 1283725 | 2/1991 |
| JP | 6-67403 | 3/1994 |
| JP | 8051068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |

OTHER PUBLICATIONS

Pistor, Thomas V., "Rigorous 3D Simulation of Phase Defects in Alternating Phase-Shifting Masks," Proceedings of SPIE 4562-1038 (Mar. 2002), 13 pages.

Ogawa, Kiyoshi, et al., "Phase Defect Inspection by Differential Interference," Proceedings of SPIE 4409-71, Apr. 26, 2001, 12 pages.

Rhyins, P., et al., "Characterization of Quartz Etched PSM Masks for KrF Lithography at the 100 nm node," Proceedings of SPIE 4562 (Mar. 2002), 486-495.

Sewell, Harry, et al., "An Evaluation of the Dual Exposure Technique," (As early as 2002*), 11 pages *The date is based on references 8&9 of the article of Feb. 16, 2001 and Feb. 27, 2002, respectively.

Wang, Ruoping, et al., "Polarized Phase Shift Mask: Concept, Design, and Potential Advantages to Photolithography Process and Physical Design," Proceedings of SPIE 4754-105, Apr. 25, 2002, 12 pages.

Matsuoka, et al., "Application of Alternating Phase-Shifting Mask to 0.16um CMOS Logic Gate Patterns," SPIE Proc. 3051, Mar. 10-14, 1997, 10 pages.

Semmier, Armin, et al., "Application of 3D EMF Simulation for Development and Optimization of Alternating Phase Shifting Masks," Proc. of SPIE 4346-37, Mar. 1, 2001, 12 pages.

Wong, Alfred K., "Polarization Effects in Mask Transmission," Proc. of SPIE 1674, Mar. 8, 1992, 8 pages.

Ackmann, Paul, et al., "Phase Shifting and Optical Proximity Corrections to improve CD control on Logic Devices in Manufacturing for sub 0.35 um J-Line," Proc. of SPIE 3051-07, Mar. 1997, 8 pages.

Spence, C., et al., "Detection of 60 degree Phase defects on Alternating PSMs," Proc. of SPIE 3412-73, Apr. 1998, 2 pages.

Sugawara, Minoru, et al., "Defect printability study of attenuated phase-shifting masks for specifying inspection sensitivity," Proc. SPIE 2621-49, Sep. 1995, 16 pages.

Schmidt, Regina, et al., "Impact of Coma on CD Control for Multiphase PSM Designs," Proc. SPIE 3334-02, Feb. 1998, 11 pages.

Erdmann, Andreas, "Topography effects and wave aberrations in advanced PSM-technology," Proc. SPIE 4346-36, Mar. 1, 2001, 28 pages.

Granik, Yuri et al., "CD variation analysis technique and its application to the study of PSM mask misalignment," Proc. SPIE 4186-94, Sep. 2000, 9 pages.

Ishiwata, Naoyuki, et al., "Fabrication of Phase-Shifting Mask," Proc. SPIE 1463, Mar. 1991, 11 pages.

Levenson, Marc D., et al., "Phase Phirst! An improved strong-PSM paradigm," Proc. SPIE 4186-42, Sep. 2000, 10 pages.

Levenson, Marc. D., et al., "SCAA mask exposures and Phase Phirst design for 110nm and below," Proc. SPIE 4346-817, Sep. 2001, 10 pages.

Morikawa, Yasutaka, et al., "100nm-Alt.PSM structure discussion for ArF lithography," Proc. SPIE 4409-22, Apr. 2001, 15 pages.

Ozaki, T., et al., "A 0.15um KrF Lithography for 1Gb DRAM Product using Highly Printable Patterns and Thin Resist Process," 1998 Symposium on VLSI Technology, Jun. 1998, Honolulu, Hawaii, 2 pages.

Ronse, Kurt, et al., "Comparison of various phase shift strategies and application to 0.35 um ASIC designs," Proc. SPIE 1927, 1993, 15 pages.

Rosenbluth, Alan E., et al., "Optimum Mask and Source Patterns to Print a Given Shape," Proc. SPIE 4346-49, Mar. 1, 2001, 17 pages.

Suzuki, Akiyoshi, et al., "Multilevel imaging system realizing k1=0.3 lithography," Proc. SPIE 3679-36, Mar. 1999, 13 pages.

Vandenberghe, G., et al., "(Sub-) 100nm gate patterning using 248nm alternating PSM," Mentor Graphics White Paper, May 2001, 9 pages.

Fritze, M., et al., "100-nm Node Lithography With KrF?" Feb. 1, 2001, 14 pages.

Fukuda, Hiroshi, et al., "Patterning of Random Interconnect Using Double Exposure of Strong-Type PSMs," Proc. SPIE 4346-695, Sep. 2001, 8 pages.

Ferguson, Richard A., et al., "Pattern-Dependent Correction of Mask Topography Effects for Alternating Phase-Shifting Masks," Proc. SPIE 2440-349, May 1995, 12 pages.

Toublan, Olivier, et al., "Phase and Transmission Errors Aware OPC Solution for PSM: Feasibility Demonstration," Proc. SPIE 4186-95, Sep. 13, 2000, 7 pages.

Yanagishita, Yuichiro, et al., "Phase-Shifting Photolithography Applicable to Real IC Patterns," Proc. SPIE 1463, Mar. 3, 1991, 11 pages.

Pierrat, C., "Investigation of Proximity Effects in Alternating Aperture Phase Shifting Masks," Sep. 2000, 11 pages.

Cote, Michel, et al., "A Practical Application of Full-Feature Alternating Phase-Shifting Technology for a Phase-Aware Standard-Cell Design Flow," Jun. 1, 2001, 6 pages.

Hanyu, Isamu, et al., "New phase-shifting mask with highly transparent SiO2 phase shifters," Proc. SPIE 1264-167, Jun. 1990, pp. 166-177.

McCallum, Martin, et al., "Alternating PSM Mask Performance—A Study of Multiple Fabrication Technique Results," Proc. SPIE 4346-723, Sep. 2001, 6 pages.

Nagahiru, Y., "Improved Mask Technique for Photolithography Applied to 0.25um LSI—Improvement of Resolution, Pattern Correction, Exposure Area", Nikkei Microdevices, pp. 1-6, Apr. 1995.

Okamoto, Y., et al., "A New Phase Shifting Mask Technology for Quarter Micron Photolithography", SPIE, vol. 2512, pp. 311-318 (1995).

Pierrat, C., et al., "Required Optical Characteristics of Materials for Phase-Shifting Masks", Applied Optics, vol. 34, No. 22, pp. 4923-4928, Aug. 1, 1995.

Galan, G., et al., "Alternating Phase Shift Generation for Coplex Circuit Designs", SPIE, vol. 2884, pp. 508-519, Sep. 18-20, 1996.

Kanal, H., et al., "Sub-Quarter Micron Lithography with the Dual-Trench Type Alternating PSM", SPIE, vol. 2793, pp. 165-173 (1996).

Ishiwara, N., et al., "Novel Alternating Phase Shift Mask with Improved Phase Accuracy", SPIE, Proceedings Of The 17th Annual Symposium On Photomask Technology And Management, vol. 3236, pp. 243-249 (1997).

Morimoso, H., et al., "Next Generation Mask Strategy—Technologies are Ready for Mass Production of 256MDRAM?", SPIE, vol. 3236, pp. 188-189 (1997).

Roman, B., et al., "Implications of Device Processing on Photomask CD Requirements", SPIE, vol. 3236 (1997) (Abstract Only).

Nakae, A., et al., "A Proprosal for Pattern Layout Rule in Application of Alternating Phase Shift Mask", SPIE, vol. 3096, pp. 362-374 (1997).

Tanjimoto, E., et al., "Hierarchical Mask Data Design System (PROPHET) for Aerial Image Simulation, Automatic Phase-Shifter Placement, and Subpeak Overlap Checking", SPIE, vol. 3096, pp. 163-172 (1997).

Yamamoto, K., et al., "Hierarchical Processing of Levenson-Type Phase Shifter Generation", Jpn. J. Appl. Phys., vol. 36, Part I, No. 12B, pp. 7499-7503, Dec. 1997.

Gordon, R., et al., "Design and Analysis of Manufacturable Alternating Phase-Shifting Masks", Bacus News, vol. 14, Issue 12, pp. 1-9, Dec. 1998.

Nara, M., et al., "Phase Controllability Improvement for Alternating Phase Shift Mask", Dai Nippon Printing Co., Ltd. (16 pages).

Ohnuma, H., et al., "Lithography Computer Aided Design Technology for Embedded Memory in Logic", Jpn. J. Appl. Phys., vol. 37, Part I, No. 12B, pp. 6686-6688, Dec. 1998.

Brunner, T., et al., "170 nm Gates Fabricated by Phase-Shift Mask and Top Anti-Reflector Process", SPIE, Optical/Laser Microlithography VI, Vo. 1927, pp. 182-189 (1993).

Lin, B.J., "Phase-Shifting Masks Gain an Edge", IEEE Circuits & Devices, pp. 28-35. Mar. 1993.

Moniwa, A., et al., "Algorithm for Phase-Shift Mask Design with Priority on Shifter Placement", Jpn. J Appl. Phys., vol. 32, Pt. 1, No. 12B, pp. 5874-5879, Dec. 1193.

Ooi, K., et al., "Computer Aided Design Software for Designing Phase-Shifting Masks", Jpn. J. Appl. Phys., vol. 32, Pt. 1. No. 12B, pp. 5887-5891, Dec. 1993.

Ohtsuka, H., et al., "Evaluation of Repair Phase and Size Tolerance for a Phase-Shift Mask", J Vac. Sci. Technol B, vol. 11, No. 6, pp. 2665-2668, Nov./Dec. 1993.

Ronse, K., et al., "Comparison of Various Phase Shift Strategies and Application to 0.35um ASIC Designs", SPIE—Optical/Laser Microlithography VI, vol. 1927, pp. 2-16 (1993).

Galan, G., et al., "Application of Alternating-Type Phase Shift Mask to Polysilicon Level for Random Logic Circuits", Jpn. J. Appl. Phys., vol. 33, pp. 6779-6784 (1994).

Mizuno, F., et al., "Practical Phase-Shifting Mask Technology for 0.3um Large Scale Integrations", J. Vac. Sci. Technol. B, vol. 12, No. 6, pp. 3799-3803, Nov./Dec. 1994.

Pati, Y.C., et al., "Phase-Shifting Masks for Microlithography: Automated Design and Mask Requirements", J. Opt. Soc. Am., vol. 11, No. 9, pp. 2438-2452, Sep. 1994.

Stirniman, J., et al., "Wafer Proximity Correction and its Impact on Mask-Making", Bacus News, vol. 10, Issue 1. pp. 1, 3-7, 10-12, Jan. 1994.

Waas, T., et al., "Automatic Generation of Phase Shift Mask Layouts", Microelectronic Engineering. vol. 23, pp. 139-142 (1994).

Barouch, E., et al., "OPTIMASK: An OPC Algorithm for Chrome and Phase-Shift Mask Design", SPIE, Vo. 2440, pp. 192-206, Feb. 1995.

Moniwa, A., et al., "Heuristic Method for Phase-Conflict Minimization in Automatic Phase-Shift Mask Design", Jpn. J. Appl. Phys., vol. 34, Pt. 1, No. 12B, pp. 6584-6589, Dec. 1995.

Langston, J., et al., "Extending Optical Lithography to 0.25um and Below", Solid State Technology, pp. 57-64, Mar. 1995.

Wong, A., et al., "Investigating Phase-Shifting Mask Layout Issues Using a Cad Toolkit", IEEE, pp. 27.4.1-27.4.4 (1991).

Terasawa, T., et al., "Imaging Characteristics of Multi-Phase-Shifting and Halftone Phase-Shifting Masks", Japanese Journal of Applied Physics, vol. 30, No. 11B, pp. 2991-2997, Nov. 1991.

Burggraaf, P., "Four More Significant Japanese Advances in Phase Shifting Technology", Semiconductor International, p. 16, Dec. 1991.

Kemp, K., et al., "Optimized Phase Shift Mask Designs for Real Devices", KTI Microlithography Seminar, pp. 67-75, Oct. 14-15, 1991.

Newmark, D., et al., "Phase-Shifting Mask Design Tool", SPIE—11th Annual BACUS Symposium on Photmask Technology, vol. 1604, pp. 326-235, Sep. 25-27, 1991.

Nolscher, C., et al., "Investigation of Self-Aligned Phase-Shifting Reticles by Simulation Techniques", SPIE—Optical/Laser Microlithography IV, vol. 1463, pp. 135-150 (1991).

Inoue, S., et al., "Simulation Study on Phase-Shifting Masks for Isolated Patterns", Japanese Journal of Applied Physics, vol. 30. No. 11B, pp. 3010-3015, Nov. 1991.

Watanabe, H., et al., "Detection and Printability of Shifter Defects in Phase-Shifting Masks", Japanese Journal of Applied Physics, vol. 30, No. 11B, pp. 3016-3020, Nov. 1991.

Watanabe, H., et al., "Pattern Transfer Characteristics of Transparent Phase Shifting Mask", Japanese Journal of Applied Physics, vol. 30, No. 11B, pp. 3004-3009, Nov. 1991.

Jinbo, H., et al., "Application of Blind Method to Phase-Shifting Lithography", IEEE, 1992 Symposium On VLSI Technology Digest Of Technical Papers, pp. 112-113 (1992).

Watanabe, H., et al., "Detection and Printability of Shifter Defects in Phase-Shifting Masks II Defects Characteristics", Jpn. J Appl. Phys., vol. 31, pp. 4155-4160 (1992).

Pierrat, C., et al., "Phase-Shifting Mask Topography Effects on Lithographic Image Quality", IEEE, pp. 3.3.1-3.3.4 (1992).

Burggraaf, P., "Lithography's Leading Edge, Part I: Phase-Shift Technology and Part 2: I-Line and Beyond", Semiconductor International, pp. 43-47 and 52-56, Feb. 1992.

IBM, "Phase-Shift Mask Utilizing Silicon Oxy-Nitride as a Low Reflectivity Phase-Shift Layer", IBM Technical Disclosure Bulletin, vol. 34, No. 10B, pp. 360-361, Mar. 1992.

Levenson, M., et al., "Improving Resolution in Photolithography with a Phase-Shifting Mask", IEEE, Transactions On Electron Devices, vol. ED-29, No. 12, pp. 1828-1836, Dec. 1982.

Levenson, M., et al., "The Phase-Shifting Mask II: Imaging Simulations and Submicrometer Resist Exposures", IEEE Transactions on Electron Devices, vol. ED-31, No. 6, pp. 753-763, Jun. 1984.

Terasawa, T., et al., "0.3-Micron Optical Lithography Using a Phase-Shifting Mask", SPIE, Optical/Laser Microlithography II, vol. 1088, pp. 25-33, Mar. 1989.

Nitayama, A., et al., "New Phase Shifting Mask with Self-Aligned Phase Sifters for a Quarter Micron Photolithography", IEDM, pp. 3.3.1-3.3.4, Dec. 3-6, 1989.

Jinbo, H., et al., "0.2um or Less i-Line Lithography by Phase-Shifting-Mask Technology", IEEE, pp. 33.3.1-33.3.4 (1990).

Neureuther, A., "Modeling Phase Shifting Masks", SPIE. 10th Annual Symposium On Microlithography, vol. 1496, pp. 80-85 (1990).

Yamanaka, T., et al., "A 5.9um2 Super Low Power SRAM Cell Using a New Phase-Shift Litography", IEDM, pp. 18.3.1-18.3.4 (1990).

Inokuchi, K., et al., "Sub-Quarter Micron Gate Fabrication Process Using Phase-Shifting-Mask for Microwave GaAs Devices", Extended Abstracts Of The 1991 Intl. Conference On Solid State Devices And Materials, Yokohama, Japan, pp. 92-94 (1991).

Inokuchi, K., et al., "Sub-Quarter-Micron Gate Fabrication Process Using Phase-Shifting Mask for Microwave GaAs Devices", Japanese Journal Of Applied Physics, vol. 30, No. 12B, pp. 3818-3821, Dec. 1991.

Jinbo, H., et al., "Improvement of Phase-Shifter Edge Line Mask Method", Japanese Journal Of Applied Physics, vol. 30, No. 11B, pp. 2998-3003, Nov. 1991.

Kimura, T., et al., "Subhalf-Micron Gate GaAs Mesfet Process Using Phase-Shifting-Mask Technology", IEEE, GaAs IC Symposium, pp. 281-284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346-355 (1991).

Hirai, Y., et al., "Automatic Pattern Generation System for Phase Shifting Mask", 1991 Symposium on VLSI Technology, Digest of Technical Papers, pp. 95-96, May 28-30, 1991.

Fukuda, H., "Node-Connection/Quantum Phase-Shifting Mask: Path to Below 0.3um Pirch. Proximity Effect Free, Random Interconnects and Memory Patterning", J. Vac. Sci. Technol. B, vol. 17, No. 6, pp. 3291-3295, Nov./Dec. 1999.

Spence, C., et al., "Integration of Optical Proximity Correction Strategies in Strong Phase Shifters Design for Poly-Gate Layers", Bacus News, vol. 15, issue 12, pp. 1, 4-13, Dec. 1999.

Kuo, C., et al., "Extension of Deep-Ultraviolet Lithography for Patterning Logic Gates Using Alternating Phase Shifting Masks", J. Vac. Sci. Technol. B, vol. 17, No. 6, pp. 3296-3300, Nov./Dec. 1999.

Palmer, S., et al., "Dual Mask Model-Based Proximity Correction for High Performance 0.10um CMOS Process", The 44th International Conference on Electron, Ion and Photon Beam Technology and Nanofabrication Abstracts, pp. 18-19, May 30-Jun. 3, 2000.

Kiknehi, K., et al., "Method of Expanding Process Window for the Double Exposure Technique with alt-PSMs" Optical Microlithography XIII, Proceeding of SPIE, vol. 4000, pp. 121-131 (2000).

Cooke, M., "OPC/PSM Designs For Poly Gate Layers", European Semiconductor vol. 22, No. 7, pp. 57-59 Jul. 2000.

Granik, Y., et al., "Sub-Resolution Process Windows And Yield Estimation Technique Based On Detailed Full-Chip CD Simulation" SPIE, vol. 4182, pp. 335-341 (2000).

Piat, M., et al., "The Impact of Optical Enhancement Techniques on the Mask Error Enhancement Funchtion IMEBF)" SPIE vol. 4000, pp. 206-214, Mar. 1-3, 2000.

Mansuripur, M., et al. "Projection Photolithography", Optics & Photonics News 11, 17 pages, Feb. 2000.

* cited by examiner

FIG. 5
PRIOR ART
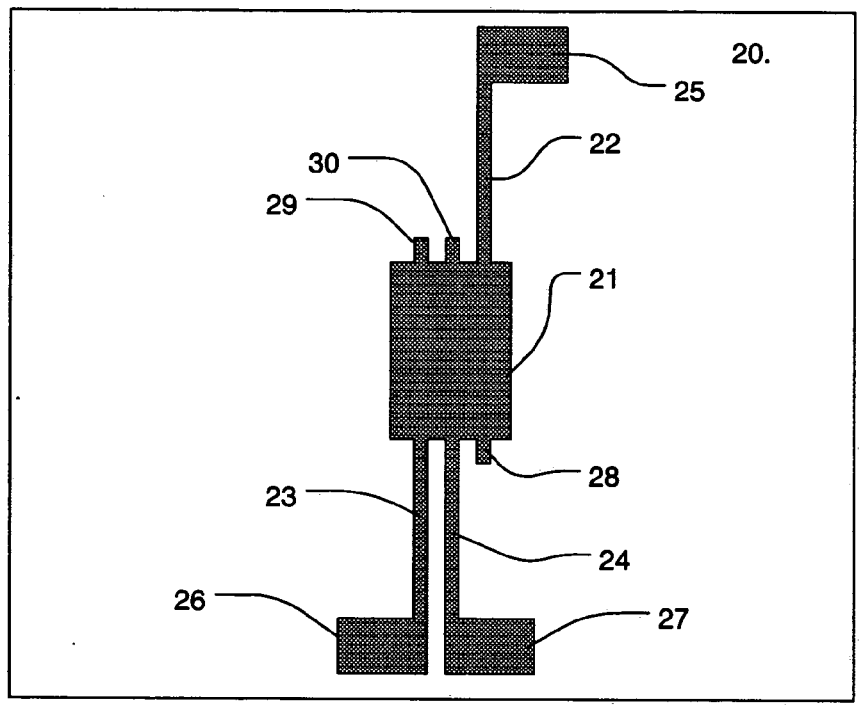
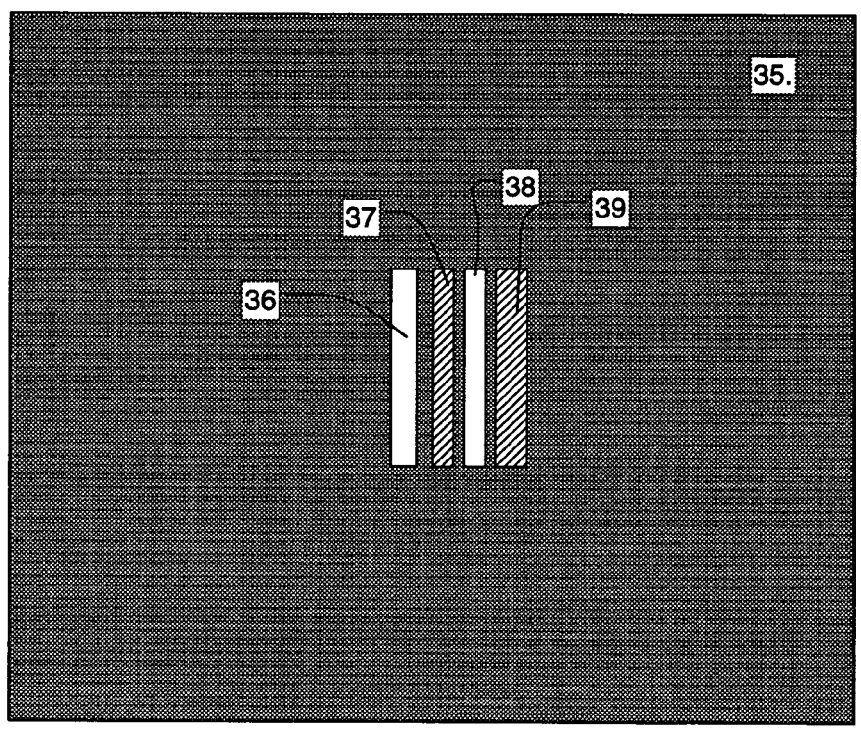
FIG. 6
PRIOR ART

Main issues:
Isolated lines
Isolated spaces

The CD issues can be addressed using OPC but the process latitude will still be too low Layout Simulation

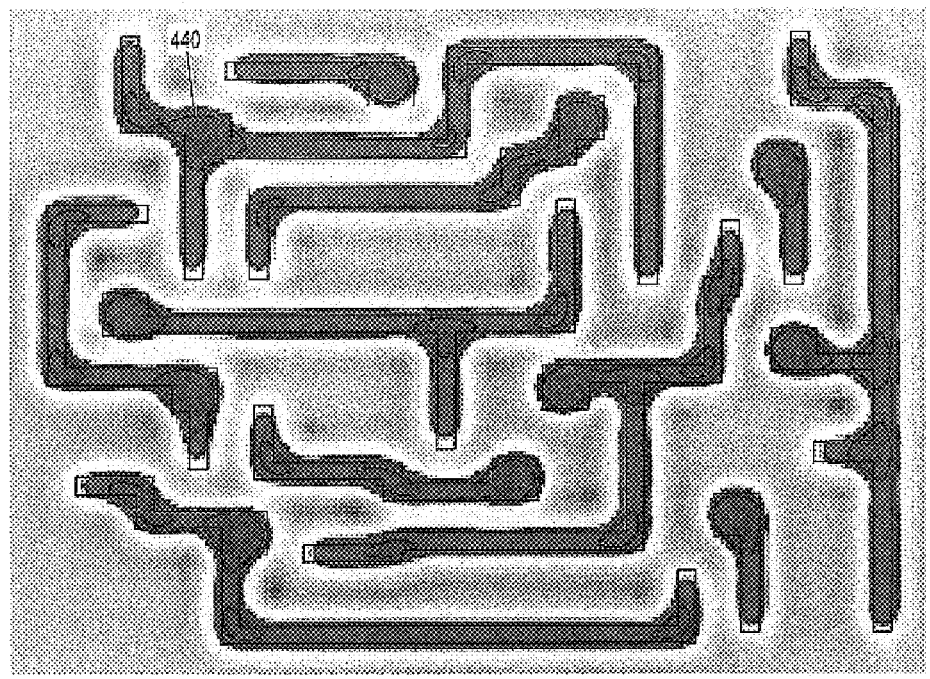
FIG. 28
FIG. 29
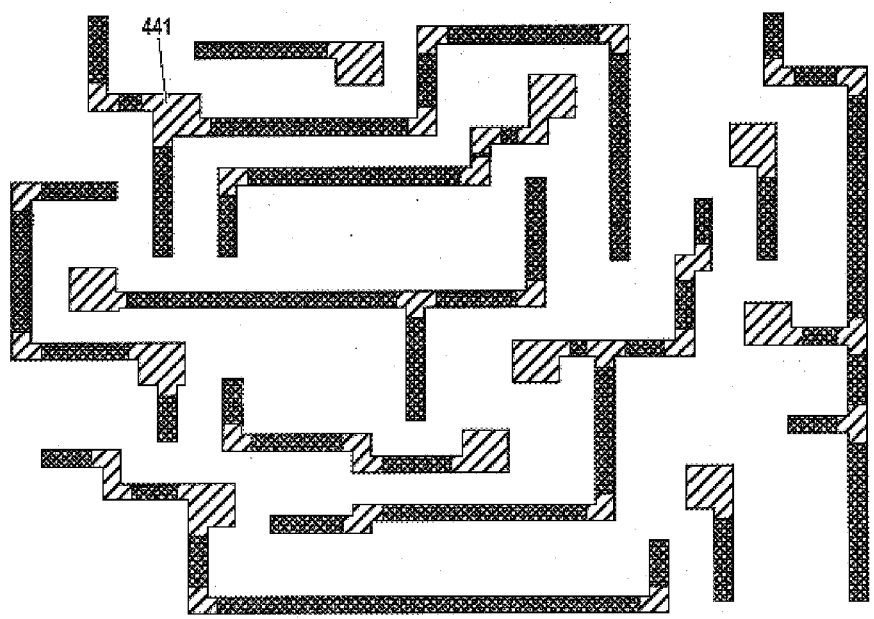

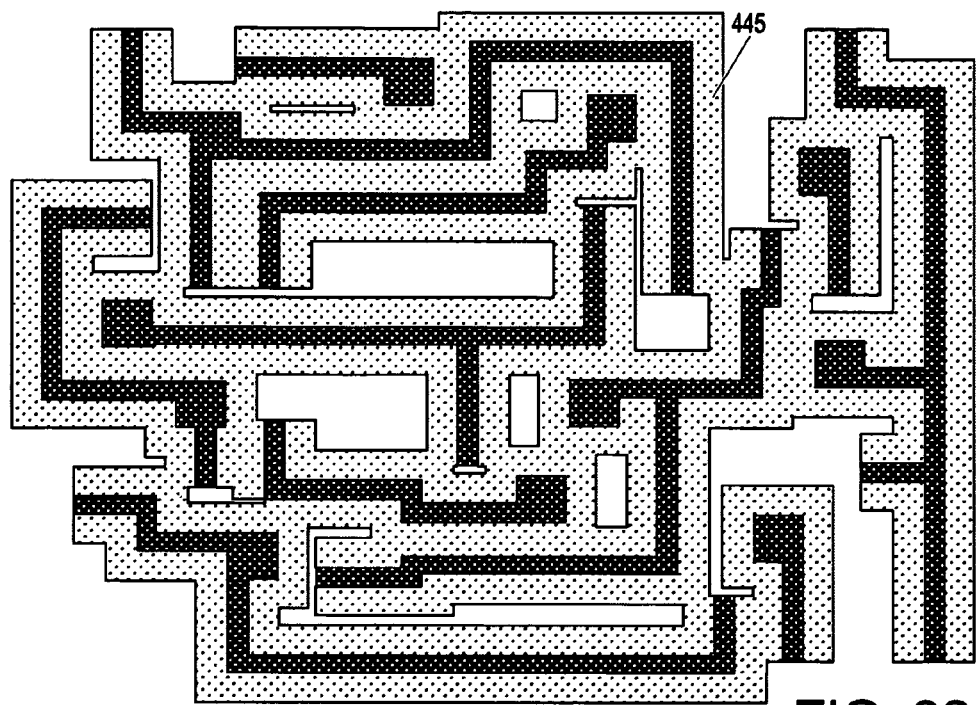
FIG. 32
FIG. 33
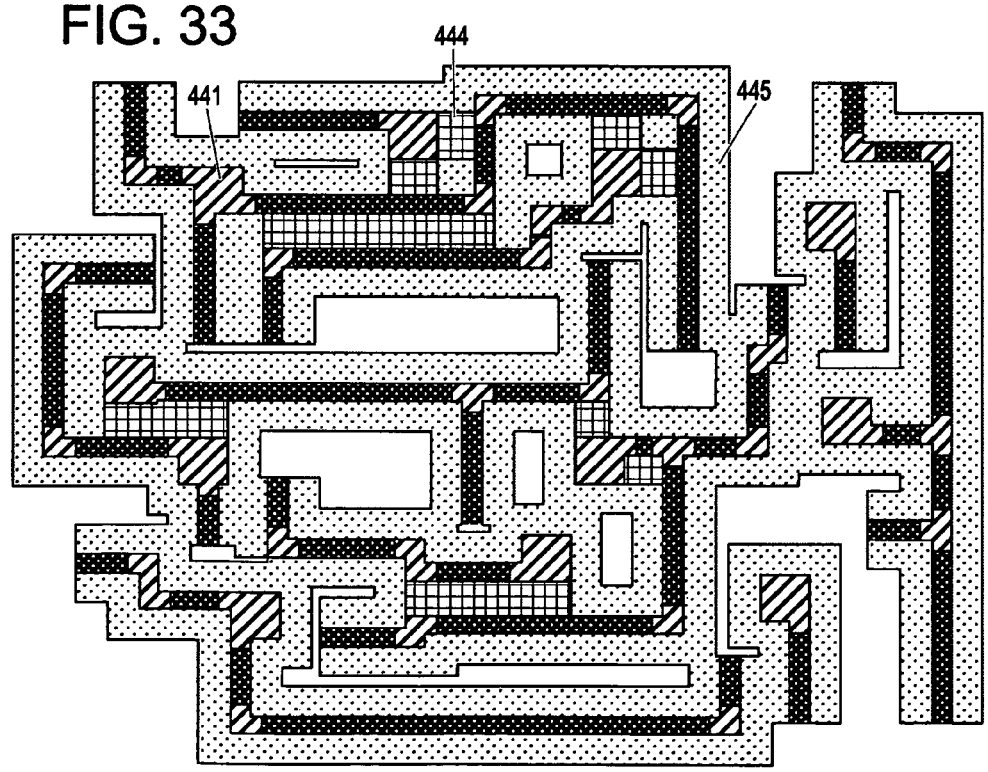

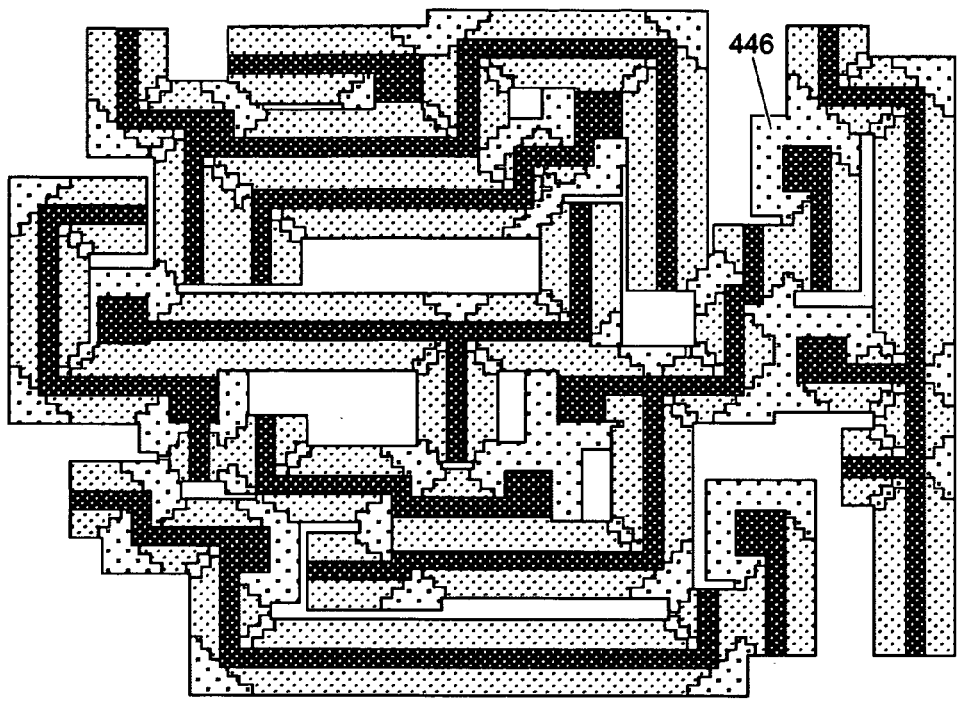
FIG. 34
FIG. 35
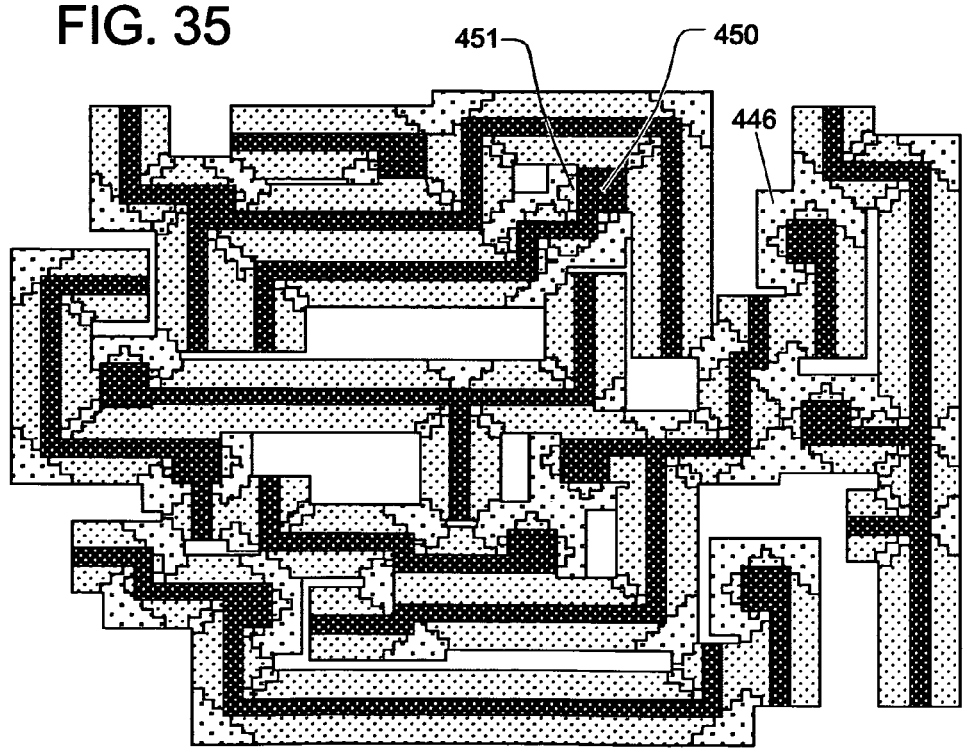

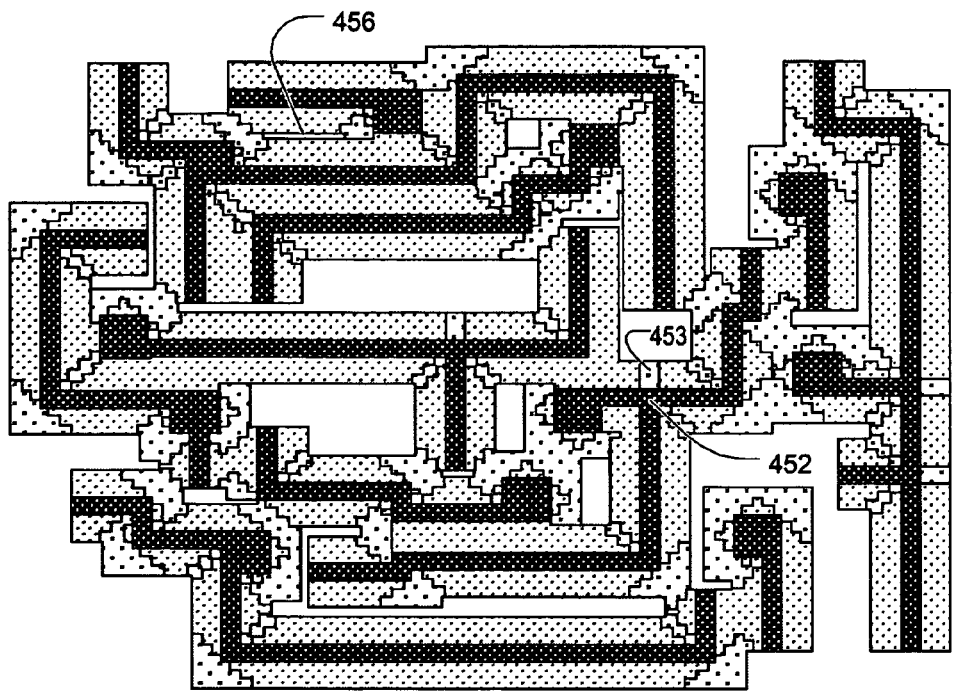
FIG. 36
FIG. 37
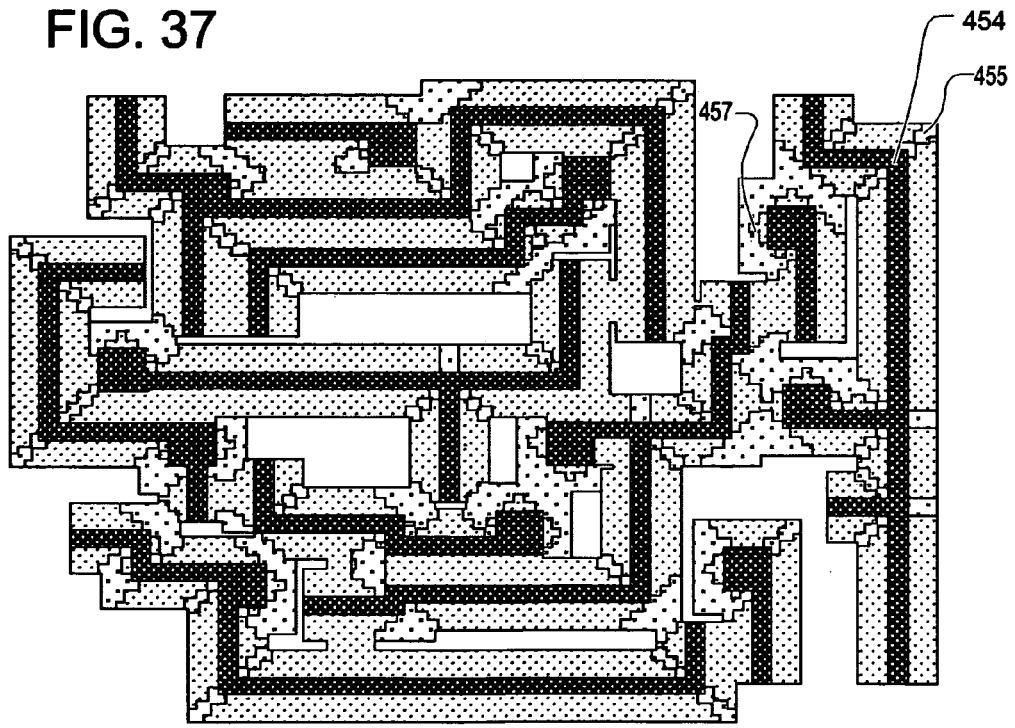

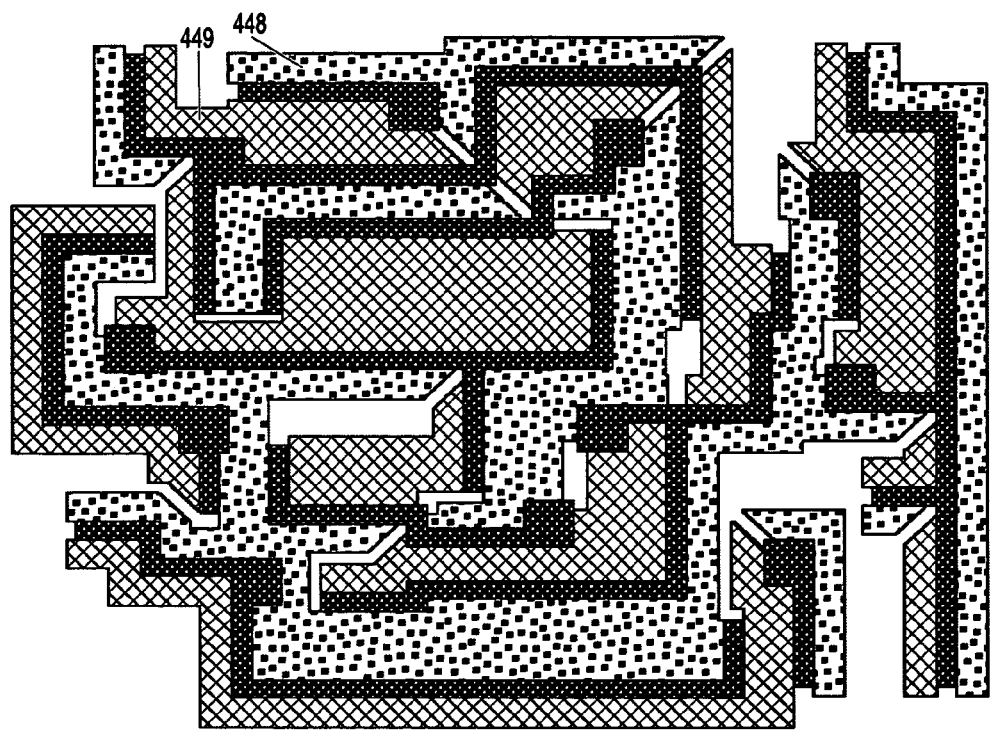
FIG. 39
FIG. 40
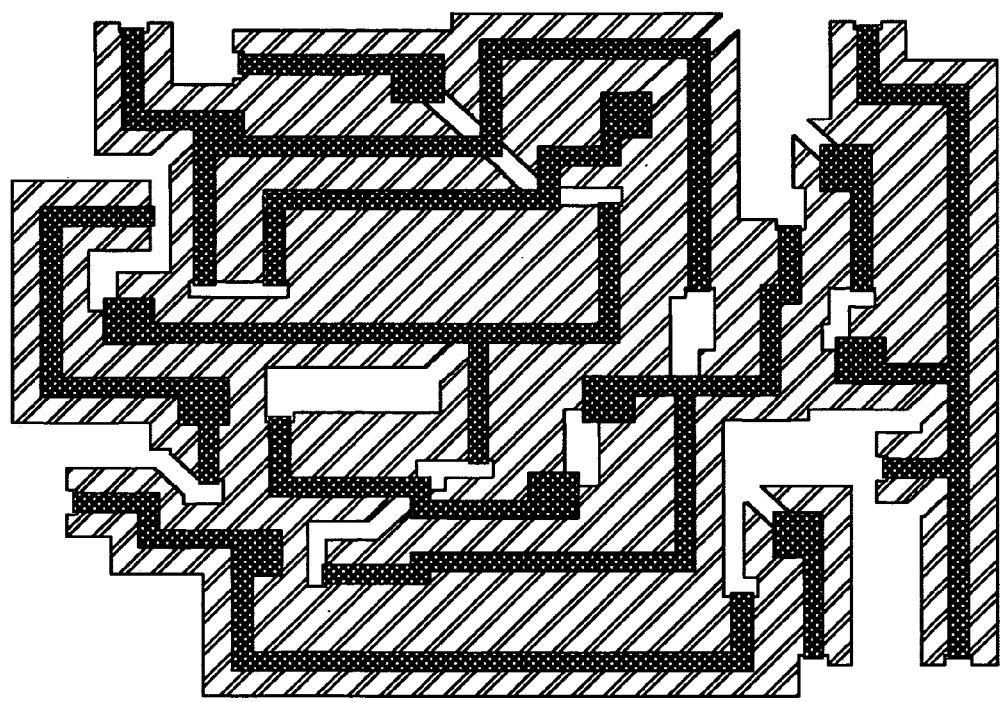

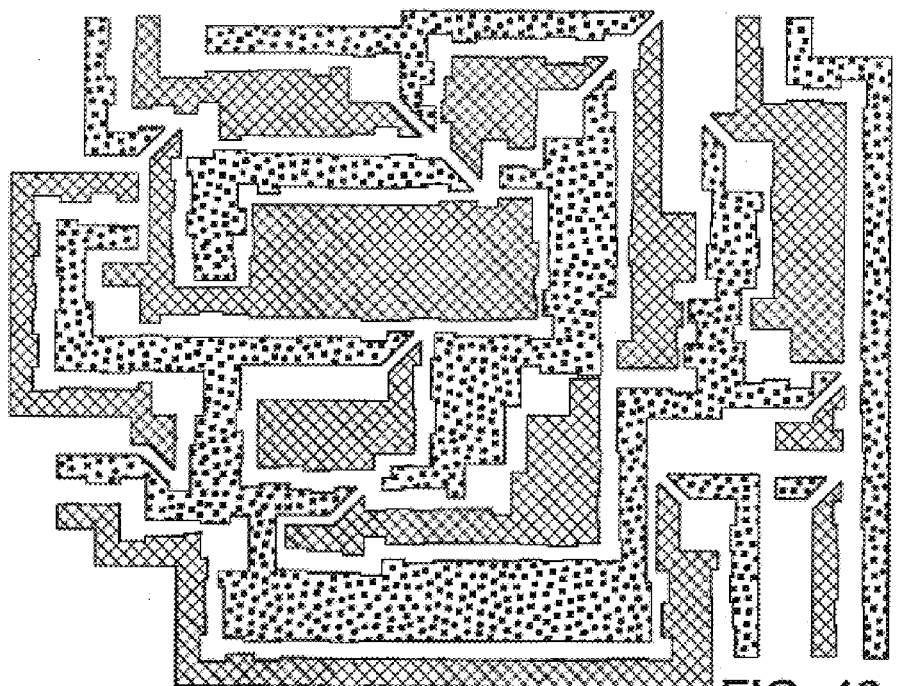
FIG. 42
FIG. 43
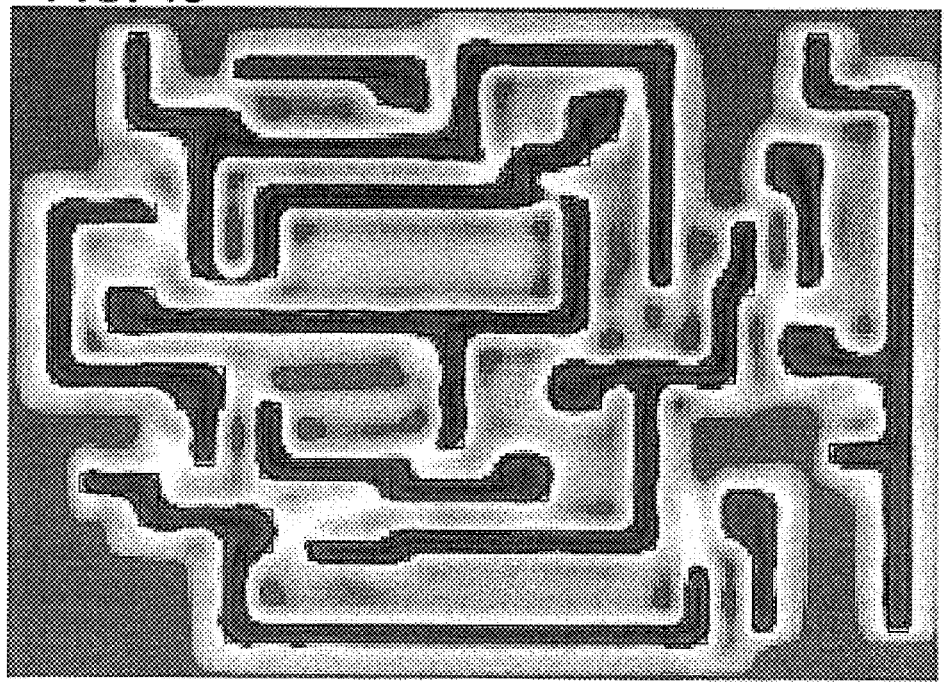

PHASE SHIFT MASKING FOR COMPLEX PATTERNS WITH PROXIMITY ADJUSTMENTS

RELATED APPLICATIONS

The present application is a continuation of U.S. patent application Ser. No. 10/068,513 filed 6 Feb. 2002, now U.S. Pat. No. 6,733,929 entitled "Phase Shift Masking for Complex Patterns with Proximity Adjustments," invented by Christophe Pierrat.

The present application is a continuation of U.S. patent application Ser. No. 10/068,513 filed 6 Feb. 2002, entitled "Phase Shift Masking for Complex Patterns with Proximity Adjustments," invented by Christophe Pierrat, which claims the benefit under 35 U.S.C. 119(e), and all other available benefits, of prior U.S. Provisional Application No. 60/215,938; filed 5 Jul. 2000; entitled "Phase Shift Masking for Complex Layouts"; invented by Christophe Pierrat, which is incorporated by reference as if fully set forth herein.

The present application is a continuation of U.S. patent application Ser. No. 10/068,513 filed 6 Feb. 2002, entitled "Phase Shift Masking for Complex Patterns with Proximity Adjustments," invented by Christophe Pierrat, which application is related to, claims the benefit of priority of, and incorporates by reference, the U.S. Provisional Patent Application Ser. No. 60/296,788 filed 08 Jun. 2001 entitled "Phase Conflict Resolution for Photolithographic Masks" having inventors Christophe Pierrat and Michael Côté and assigned to the assignee of the present invention.

The present application is a continuation of U.S. patent application Ser. No. 10/068,513 filed 6 Feb. 2002, entitled "Phase Shift Masking for Complex Patterns with Proximity Adjustments," invented by Christophe Pierrat, which application is related to, claims the benefit of priority of, and incorporates by reference, the U.S. Provisional Patent Application Ser. No. 60/304,142 filed 10 Jul. 2001 entitled "Phase Conflict Resolution for Photolithographic Masks" having inventors Christophe Pierrat and Michael Côté and assigned to the assignee of the present invention.

The present application is a continuation of U.S. patent application Ser. No. 10/068,513 filed 6 Feb. 2002, entitled "Phase Shift Masking for Complex Patterns with Proximity Adjustments," invented by Christophe Pierrat, which application is a continuation-in-part of U.S. patent application Ser. No. 09/932,239, entitled "Phase Conflict Resolution for Photolithographic Masks," filed 17 Aug. 2001, having inventors Christophe Pierrat and Michel Côté.

The present application is a continuation of U.S. patent application Ser. No. 10/068,513 filed 6 Feb. 2002, entitled "Phase Shift Masking for Complex Patterns with Proximity Adjustments," invented by Christophe Pierrat, which application is a continuation-in-part of U.S. patent application Ser. No. 09/669,368 (now U.S. Pat. No. 6,524,752), entitled "Phase Shift Masking for Intersecting Lines," filed 26 Sep. 2000, now U.S. Pat. No. 6,524,752 having inventor Christophe Pierrat.

BACKGROUND OF THE INVENTION

1. Field of the Invention

The present invention relates to manufacturing small dimension features of objects, such as integrated circuits, using photolithographic masks. More particularly, the present invention relates to the application of phase shift masking to complex layouts for integrated circuits and similar objects.

2. Description of Related Art

Phase shift masking, as described in U.S. Pat. No. 5,858,580, has been applied to create small dimension features in integrated circuits. Typically the features have been limited to selected elements of the design, which have a small, critical dimensions. Although manufacturing of small dimension features in integrated circuits has resulted in improved speed and performance, it is desirable to apply phase shift masking more extensively in the manufacturing of such devices. However, the extension of phase shift masking to more complex designs results in a large increase in the complexity of the mask layout problem. For example, when laying out phase shift areas on dense designs, phase conflicts will occur. One type of phase conflict is a location in the layout at which two phase shift windows having the same phase are laid out in proximity to a feature to be exposed by the masks, such as by overlapping of the phase shift windows intended for implementation of adjacent lines in the exposure pattern. If the phase shift windows have the same phase, then they do not result in the optical interference necessary to create the desired effect. Thus, it is necessary to prevent inadvertent layout of phase shift windows in phase conflict.

Another problem with laying out complex designs which rely on small dimension features, arises because of isolated exposed spaces which may have narrow dimension between unexposed regions or lines. Furthermore, proximity effects including optical proximity effects, resist proximity effects, and etch proximity effects, can have greater impact on the layout of dense, small dimension patterns.

Because of these and other complexities, implementation of a phase shift masking technology for complex designs will require improvements in the approach to the design of phase shift masks, and new phase shift layout techniques.

SUMMARY OF THE INVENTION

The present invention provides techniques for extending the use of phase shift techniques to implementation of masks for complex layouts in the layers of integrated circuits, beyond selected critical dimension features such as transistor gates to which such structures have been limited in the past. The invention provides a method that includes identifying features for which phase shifting can be applied, automatically mapping the phase shifting regions for implementation of such features, resolving phase conflicts which might occur according to a given design rule, applying assist features, and adjusting for proximity correction shapes within phase shift windows and within trim mask shapes associated with the phase shift windows. The present invention is particularly suited to opaque field phase shift masks which are designed for use in combination with trim masks for clearing unwanted artifacts of the phase shift masking step, and optionally defining interconnect structures and other types of structures, necessary for completion of the layout of the layer.

In one embodiment, the process of identifying features suitable for implementation using phase shifting includes reading a layout file which identifies features of the complex pattern to be exposed.

In one preferred embodiment, the phase shift mask includes an opaque field, and the phase shift regions include a plurality of transparent windows having a first phase within the opaque field, and a plurality of complementary transparent windows having a second phase approximately 180 degrees out of phase with respect to the first phase, within the opaque field. The opaque field leaves unexposed lines formed using the phase transition between phase shift regions unconnected to other structures in some cases. A complementary trim mask is laid out for use is conjunction with the opaque field phase shift mask. In one embodiment, the complementary trim mask is a binary mask, without phase shifting features. In other embodiments, the trim masks include various combinations of binary features, tri-color features, phase shift features, attenuated phase shift features and attenuated-opacity trim features.

The present invention provides a method for laying out an opaque field, alternating phase shift mask pattern and a trim mask pattern for use with the phase shift mask pattern to produce a target feature, and providing for proximity adjustments, including but not limited to optical proximity correction OPC adjustments, to the patterns. The phase shift mask pattern includes a first phase shift window having a first side and a second side opposite the first time and spaced away from the first side by a phase shift window width, a second phase shift window having a first side and a second side opposite the first side and spaced away from the first side by a phase shift window width, and an opaque field referred to sometimes as "control chrome," having a control width, overlying the region of phase transition along the respective first sides in between the first and second phase shift windows. The trim mask pattern includes an opaque trim shape in a location corresponding with said region of phase transition and having a trim width in the dimension parallel with said control width. According to the present invention, an adjustment for proximity effects, is applied to at least one, and preferably both, of the phase shift mask pattern and the trim mask pattern based upon one or both of the rule based correction and a model based correction to improve a match between resulting exposure pattern and a target feature. In one embodiment, the adjustment includes one, or more than one, of the following process steps:

(1) adjusting said first phase shift window width and said second phase shift window width, (2) adjusting said control width, (3) adjusting said trim width, (4) adding a sub-resolution opaque shape to one or both of the first and second phase shift windows, (5) adding a clear shape to the trim shape, and (6) adding one or more opaque shapes to one or both of the first and second phase shift windows and adding a clear shape or shapes to the trim mask pattern, where (i) the opaque shapes in the phase shift windows are at or above resolution, and clear shapes in the trim shape are below resolution in one embodiment, and are at or above resolution in another embodiment, and (ii) the opaque shapes in the phase shift windows are below resolution, and clear shapes in the trim shape are below resolution in one embodiment, and are at or above resolution in another embodiment.

The sub-resolution shapes do not "print" in the image being exposed, but affect the intensity profile at the wafer level, such as by improving contrast of the image and thereby improving process latitude, and changing the size of the printed image caused by the phase shift region in which the sub-resolution feature is laid out, such as for optical proximity correction OPC.

As a result of the layout rule, regions in the phase shift mask may result in phase conflicts. Thus, embodiments of the invention also include applying an adjustment to one or more of the phase shift regions in the phase shift mask to correct for phase conflicts. The adjustment for phase conflicts in one embodiment comprises dividing a phase shift region having a first phase into a first phase shift region having the first phase in a second phase shift region having the second phase. An opaque feature is added to the phase shift mask between the first and second phase shift regions. The complementary mask includes a corresponding opaque feature preventing exposure of the features to be exposed using the first and second phase shift regions in the phase shift mask, and includes a cut-out over the opaque feature separating the first and second phase shift regions to expose any feature resulting from the phase difference between the first and second phase shift regions. In one embodiment, the unique structure which results from the adjustment is laid out in the first instance to prevent phase conflicts in the layout, and so may not be considered an "adjustment" to correct a phase conflict in the layout.

For example, phase conflicts can arise in the implementation of a pattern consisting of an intersection of an odd number of line segments. The odd number of line segments defines a plurality of corners at the intersection. In this case, phase shift regions are laid out adjacent the line segments on either side of the corner so they have the same phase, and preferably continuing around the corner in all of the plurality of corners, except one. In one excepted corner, a first phase shift region having the first phase is laid out adjacent the line segment on one side of the corner, and a second phase shift region having the second phase is laid out adjacent the line segment on the other side of the corner. An opaque feature is added between the first and second phase shift regions in the one corner. The complementary mask includes a corresponding opaque feature preventing exposure of the intersecting line segments left unexposed by the phase shift mask, and includes a cut-out over the opaque feature separating the first and second phase shift regions to expose any feature resulting from the phase difference in the one excepted corner between the first and second phase shift regions.

The selection of the one excepted corner having the cut-out feature in the structure that defines the intersection of an odd number of line segments is implemented in various embodiments according to design rules. In one design rule, the one excepted corner is the corner defining the largest angle less than 180 degrees. In another design rule, the one excepted corner is the corner which is the greatest distance away from an active region on the integrated circuit.

In one embodiment, the pattern to be implemented includes exposed regions and unexposed regions. Exposed regions between unexposed regions (i.e., spaces between lines or other structures) having less than a particular feature size are identified for assist features. The particular feature size used for identification of exposed regions between unexposed regions may, or may not, be the same as the feature size used for selection of unexposed regions (i.e., lines) to be implemented using phase shift masking. According to this aspect of the invention, the process includes laying out phase shift regions in the phase shift mask to assist definition of edges of the unexposed regions between exposed regions.

According to another aspect of the invention, the process includes adding opaque shapes inside a particular phase shift region in the phase shift mask. The opaque shapes comprise in various embodiments features inside and not contacting the perimeter of the particular phase shift region. In other embodiments, the opaque shapes result in division of a phase shift region having a first phase into first and second phase shift regions having the same phase. An opaque shape between the first and second phase shift regions acts in one embodiment is a sub-resolution feature, and improves the shape of the resulting exposed and unexposed regions that define the target feature.

According to another aspect of the invention, the layout of phase shifting regions in an opaque field includes a step of simulating an intensity profile or other indication of the exposure pattern to be generated, and locating regions in the exposure pattern which are anomalous, such as by having higher intensity. Sub-resolution shapes features are then added to the layout covering the anomalous regions in the exposure pattern to adjust the exposure pattern to provide for better target feature definition.

The use of sub-resolution shapes within phase shift regions is applied uniquely for the formation of an array of closely spaced target features, such as an array of capacitor plates used in dynamic random access memory designs.

An overall process for producing a layout file, or a photolithographic mask is provided that includes identifying features to be implemented using phase shifting, laying out phase shifting regions so as to prevent or minimize phase conflicts, applying sub-resolution assist features to the phase shift regions, and producing a layout file. Next, a complementary trim mask is laid out to complete the exposure pattern for a target feature. Also, according to the present invention, adjustments are applied to both the trim mask pattern and the phase shift mask pattern.

One embodiment of the invention is a method for producing a computer readable definition of a photolithographic mask used for defining a layer in an integrated circuit, or other work piece, where the layer comprises a pattern including a plurality of features to be implemented with phase shifting. The method includes identifying cutting areas for phase shift regions based on characteristics of the pattern. Next, the process cuts the phase shift regions in selected ones of the cutting areas to define phase shift windows, and assigns phase values to the phase shift windows. The cutting of the regions into windows and assigning of phase shift values to the windows is basically an iterative process, in which the order of cutting and assigning depends on the particular procedure, and may occur in any order. The phase shift values assigned comprise $\phi$ and $\theta$, so that destructive interference is caused in transitions between adjacent phase shift windows having respective phase shift values of $\phi$ and $\theta$. In the preferred embodiment, $\phi$ is equal to approximately $\theta+180$ degrees. Results of the cutting of phase shift regions into phase shift windows, and assigning phase values to the phase shift windows are stored in a computer readable medium. Adjustments for proximity correction as described above are typically applied after the cutting process just described.

By identifying the cutting areas based on characteristics of the pattern to be formed, the problem of dividing phase shift regions into phase shift windows, and assigning phase shift values to the windows is dramatically simplified.

Representative criteria applied in the cutting of phase shift regions into phase shift windows, and assigning phase values to the phase shift windows, include the following:

1. Try to avoid the creation of small phase shift windows that are difficult to manufacture on the mask and that do not provide sufficient process latitude.

2. Try to keep the number of cuts to a minimum and keep the cuts with the maximum process latitude. For example, cuts originating from an outside opaque (typically chrome) corner tend to have a better process latitude than cuts originating from an inside opaque corner. Long cuts from an original opaque feature to an original opaque feature tend have more process latitude than short cuts. Cuts from an original opaque feature to a field area tend to have more process latitude than cuts from an original opaque feature to an original opaque feature.

In one embodiment of the invention, a cost function is applied, in performing the cutting and assigning steps, which relies on the identified cutting areas and on the positions and shapes of features in the pattern to be formed using the phase shift windows.

The step of identifying cutting areas includes in one embodiment of the invention, a process comprising three steps. The first step involves identifying features in the plurality of features that are characterized by non-critical process latitude to define a set of non-critical features. The second step involves identifying fields between features in the plurality of features characterized by critical process latitude to define a set of critical fields. The third step involves defining cutting areas as areas within the phase shift regions which extend between two features in the set of non-critical features, or between a feature in the set of non-critical features and a field outside the phase shift regions, without intersecting a field in the set of critical fields. The identified cutting areas are further refined in other embodiments, by changing the shape of the cutting areas or by elimination of cutting areas, based upon characteristics of the pattern, characteristics of phase shift windows which may result from cutting in the cutting area, and/or other criteria that identify areas in which cutting is less desirable.

Examples of non-critical features include elbow shaped features, T-shaped features, and polygons larger than a particular size. Parameters utilized to identify non-critical features can be determined using simulations based upon simulation criteria which tends to flag features characterized by non-critical process latitude. For example, simulations of over exposure conditions tend to identify non-critical features.

Examples of critical fields include fields between narrow lines that are close together. Parameters utilized to identify critical fields can be determined using simulations based upon simulation criteria which tend to flag fields characterized by critical process latitude. For example, simulations of under-exposure conditions tend to identify critical fields between features which bridge together across the critical field in under-exposure conditions.

In another embodiment of the invention, an article of manufacture comprising a machine readable data storage medium having stored thereon instructions executable by a data processing system defining steps for laying out a photolithographic mask according to the process is described above. In another embodiment of the invention, a data processing system including a processor and memory storing such instructions is provided.

In another embodiment, the present invention provides a photolithographic mask including a plurality of phase shift regions divided into phase shift windows in cutting areas that are defined as described above. Thus, a photolithographic mask for defining a pattern in a layer to be formed using the mask, wherein said pattern includes a plurality of features, and said layer includes fields outside said pattern, is provided that comprises a substrate, a mask layer of material on said substrate. The mask layer includes phase shift regions and fields, and a plurality of phase shift windows in the phase shift regions, the plurality of phase shift windows characterized by phase shift values that create phase transitions between the phase shift windows to form said pattern, wherein the boundaries of the phase shift windows lie within cutting areas that are defined based upon characteristics of said pattern. A set of features in the plurality of features, where features in the set are characterized by non-critical process latitude, and a set of critical fields between features in the plurality of features where fields in the set are characterized by critical process latitude. The cutting areas include areas within the phase shift regions which extend between two features in the set of features, or between a feature in the set of features and a field outside the phase shift regions, without intersecting a field in the set of critical fields.

In further embodiments, the present invention provides a method for manufacturing photolithographic masks according to the process described above, and a method for manufacturing a layer in an integrated circuit utilizing the photolithographic mask as described above. In addition, a new class of integrated circuits is provided that is manufactured according to the methods described herein, and have a patterned layer of material with a plurality of small dimension features which are closely spaced and implemented using alternate phase shift masking. The new class of integrated circuits comprise layers have a dense pattern of small features, that was not achievable applying the prior art techniques.

A method for producing integrated circuits having improved small dimension structures includes applying a photo-sensitive material to a wafer, exposing the photo-sensitive material using the phase shift mask implemented as described above, exposing the photo-sensitive material using the complementary trim mask implemented as described above, and developing the photo-sensitive material. A next process step in the method for producing integrated circuits involves the removal of material underlying the photo-sensitive material according to the resulting pattern, or addition of material over the wafer according to the pattern resulting from the use of the phase shift and complementary masks. The resulting integrated circuit has improved, and more uniform line widths, and improved and more uniform spaces between structures on the device. In some embodiments, the resulting integrated circuit has intersecting lines defined with phase shift masks.

The present invention provides techniques for extending the use of phase shift techniques to implementation of masks for a pattern having high density, small dimension features, and the use of such masks for implementing the pattern in a layer of an integrated circuit, or other work piece. For example, the techniques of the present invention are applied in areas including multiple features using phase shift windows, where those features are in close proximity. The techniques are also applied for so-called "full shift" of dense patterns on layers of a work piece.

Accordingly, the present invention provides for the design and layout of photolithographic masks, and the manufacture of integrated circuits, in which the use of phase shifting is extended to so-called "full shift" patterns, in which a pattern in the integrated circuit layer is defined utilizing alternate phase shifting techniques.

Other aspects and advantages of the present invention can be understood with review of the figures, the detailed description and the claims which follow.

BRIEF DESCRIPTION OF THE FIGURES

The patent or application file contains at least one drawing executed in color. Copies of this patent or patent application publication with color drawing(s) will be provided by the Office upon request and payment of the necessary fee.

FIG. 5 illustrates a binary mask and FIG. 6 illustrates a phase shift mask according to a prior art phase shift masking technique.

FIG. 28 is a color printout of a simulation done under over-exposure conditions which tend to identify non-critical features in the pattern.

FIG. 29 shows the pattern of FIG. 28 in which non-critical features in the pattern are marked.

FIG. 32 illustrates the layout of phase shift regions for the pattern of FIG. 28.

FIG. 33 illustrates the pattern of FIG. 32 with non-critical features and critical field areas identified.

FIG. 34 illustrates cutting areas identified for critical features in the pattern of FIG. 32.

FIG. 35 illustrates cutting areas as modified for non-critical features in the pattern of FIG. 32.

FIG. 36 illustrates cutting areas as modified to account for T-shaped features in the pattern of FIG. 32.

FIG. 37 illustrates cutting areas as modified for outside corners and small spaces in the pattern of FIG. 32.

FIG. 39 illustrates a representative layout of phase shift windows for the pattern of FIG. 32.

FIG. 40 illustrates a representative layout of a trim mask for use with the phase shift mask of FIG. 39.

FIG. 42 illustrates a representative layout of phase shift windows of FIG. 39, with optical proximity correction.

FIG. 43 illustrates a simulation of an exposure pattern using a mask as shown in FIG. 32.

DETAILED DESCRIPTION

Figure 1:
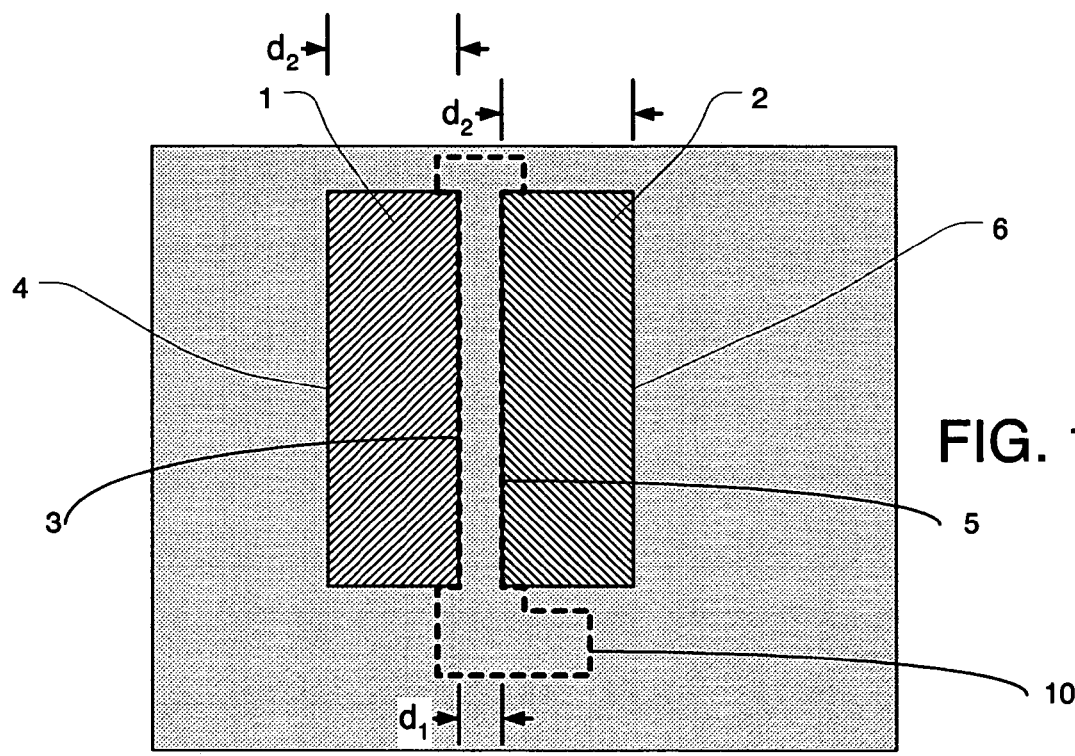
FIG. 1 illustrates a phase shift window pair in an opaque field alternating phase shift pattern for formation of a target feature, and labels a control width dimension and a phase shift window width dimension.

A detailed description of the present invention is provided with respect FIGS. 1–45. FIG. 1 shows an opaque field, alternating phase shift mask pattern including a first phase shift window 1 and a second phase shift window 2. The phase shift window 1 and a phase shift window 2 will be used to define a portion of a target feature 10 (shown as a dotted outline). More specifically, in this example, the target feature 10 corresponds to a single line transistor gate in a polysilicon level of an integrated circuit, and the area being defined by the phase shift windows corresponds to the gate region. The first phase shift window 1 includes a first side 3 and a second side 4 spaced away from the first side by a phase shift window width d2. Likewise, the second phase shift window 2 includes a first side 5 and a second side 6 spaced away from the first side by a phase shift window width d2. The phase shift window width d2 is preferably the same as the phase shift window width d2 of the first phase shift window 1 as shown here, but need not be for all embodiments. A region of phase transition between the first phase shift window 1 and the second phase shift window 2 is used for creating a pattern in a layer being manufactured. An opaque field overlies the region of phase transition along the respective first side 3 and first side 5 of the first and second phase shift windows 1 and 2. The opaque field includes a control width dimension d1.

Figure 2:
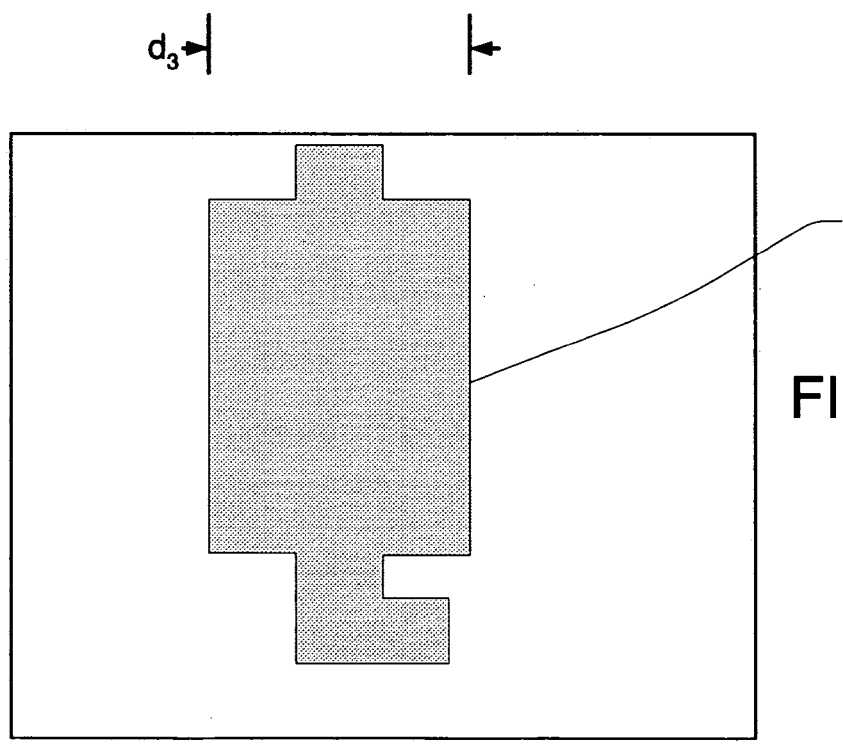
FIG. 2 illustrates a trim shape for a complementary trim mask pattern corresponding with the phase shift window pair of FIG. 1, and labels a trim width dimension.

FIG. 2 shows the trim shape 7 on a complementary mask pattern for the opaque field, alternating phase shift mask pattern of FIG. 1. The complementary mask pattern protects the gate area defined by the phase shift mask pattern and defined the remaining structures of the target feature 10. Of interest in this discussion is the larger rectangular portion of the trim shape 7 that overlays at least portions of the phase shift windows 1 and 2, and has a trim width dimension d3. In typical embodiments, the trim width d3 will be less than the total width (d2+d2+d1) of the phase shift windows 1 and 2, and the control width of the opaque field in the region of phase transition.

Figure 3:
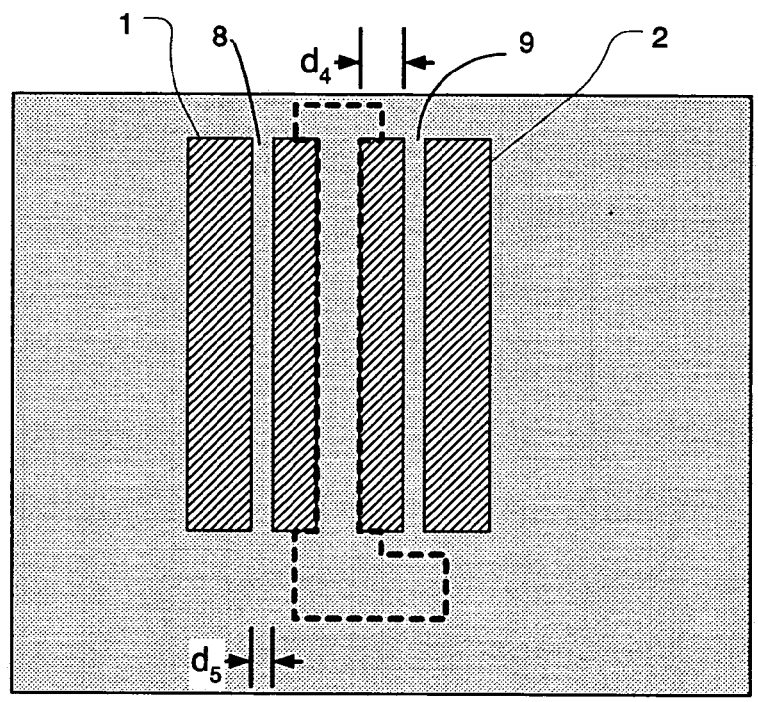
FIG. 3 illustrates shapes added for proximity correction to the basic phase shift window pair according to the present invention for formation of a target feature, and labels a feature spacing dimension and a feature width dimension.

FIG. 3 shows an opaque field, alternating phase shift mask pattern like that of FIG. 1, used to form the target feature 10 shown in dotted lines, and to which opaque shapes 8 and 9 have been added respectively, to the first phase shift window 1 and the second phase shift window 2. The opaque features are preferably sub-resolution features. In other embodiments, the opaque features are at or above the resolution for the lithographic process. Each approach is appropriate for different embodiments of the invention, as will be described more fully below. As can be seen, the opaque features 8 and 9 have a feature width dimension d5 and a feature spacing dimension d4. In the embodiment shown, the opaque shapes 8 and 9 are substantially parallel with the opaque field overlying the region of phase transition between the first phase shift window 1 and a second phase shift window 2, and divide the first and second phase shift windows into two distinct regions. Alternate embodiments of the present invention have such opaque shapes 8 and 9 which are inside one or both of the first and second phase shift windows and do not contact the perimeters of the phase shift windows (see, FIGS. 19A and 20A).

Figure 4:
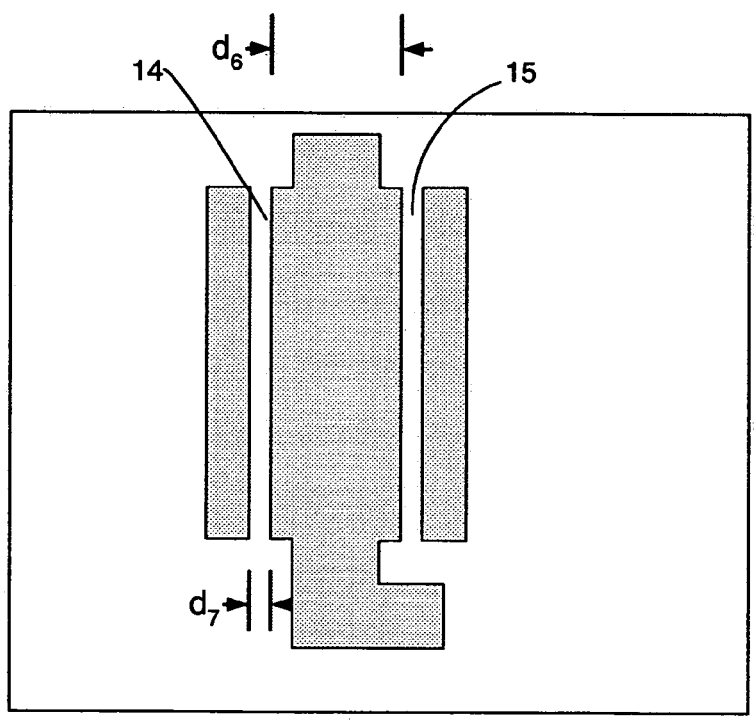
FIG. 4 illustrates shapes added for proximity correction to the trim shape for the phase shift window pair of FIG. 1, or of FIG. 3, according to the present invention, and labels a feature spacing dimension and a feature width dimension.

FIG. 4 shows a complementary mask pattern for use with a phase shift mask pattern like that of FIGS. 1 and 3. The complementary mask pattern includes a trim shape like that shown in FIG. 2, to which clear shapes 14 and 15 have been added. The clear shapes 14 and 15 have feature width dimension d7 and feature spacing dimension d6. In the embodiment shown, the clear shapes 14 and 15 are substantially parallel with the opaque field overlying the region of phase transition in the corresponding phase shift mask pattern, and divide the rectangular portion of the trim feature that overlays the phase shift windows in the phase shift mask pattern. Alternate embodiments of the present invention have one or more of such clear features which are inside the trim feature and do not contact the parameters of the trim feature. In embodiments in which the corresponding phase shift mask pattern includes opaque shapes 8 and 9, which are at or above resolution, the clear shapes 14 and 15 may also be at or above resolution and operate to expose any unwanted features caused by the opaque shapes 8 and 9. In another embodiment, the clear shapes are below, at, or above resolution and there are no shapes on the corresponding trim mask.

According to embodiments of the present invention, proximity correction for a target pattern is accomplished by applying adjustments, including one or more of the following:

(1) adjusting said first phase shift window width d2 and said second phase shift window width d2, (2) adjusting said control width d1, (3) adjusting said trim width d3, (4) adding a sub-resolution opaque shape to one or both of the first and second phase shift windows (including selecting the dimensions d4 and d5), (5) adding clear shapes to the trim shape (including selecting the dimensions d6 and d7), and (6) adding one or more opaque shapes to one or both of the first and second phase shift windows and adding a clear shape or shapes to the trim, where (i) the opaque shapes in the phase shift windows are at or above resolution, and clear shapes in the trim shape are below resolution in one embodiment, and are at or above resolution in another embodiment, and (ii) the opaque shapes in the phase shift windows are below resolution, and clear shapes in the trim shape are below resolution in one embodiment, and are at or above resolution in another embodiment.

FIG. 5 shows a binary mask for use in combination with an opaque field phase shift mask as shown in FIG. 6. The binary mask of FIG. 5 includes an opaque feature within a clear field 20. The opaque feature includes a blocking region 21 which corresponds to the features, i.e. transistor gates in an active region of a device, formed using the phase shift structures of FIG. 6. Narrow lines 22, 23 and 24 extend from the blocking region 21 to respective flag shaped elements 25, 26, 27. The narrow lines 22, 23, 24 in this example each extend through the blocking region 21, resulting in respective extension portions 28, 29, 30. The phase shift mask of FIG. 6 is formed within an opaque field 35, inside which zero degree phase shift windows 36, 37 and 180 degree phase shift windows 38, 39 are formed. The phase shift windows result in the printing of fine lines on the transitions between zero degree phase shift window 36 and 180 degree phase shift window 38, between 180 degree phase shift window 38 and zero degree phase shift window 37, and between zero degree phase shift window 37 and 180 degree phase shift window 39. These fine lines are coupled with the lines 22, 23, 24 in the binary mask of FIG. 5 for interconnection, while the blocking region 21 prevents exposure of the fine lines during the exposure using the binary mask.

Figure 7:
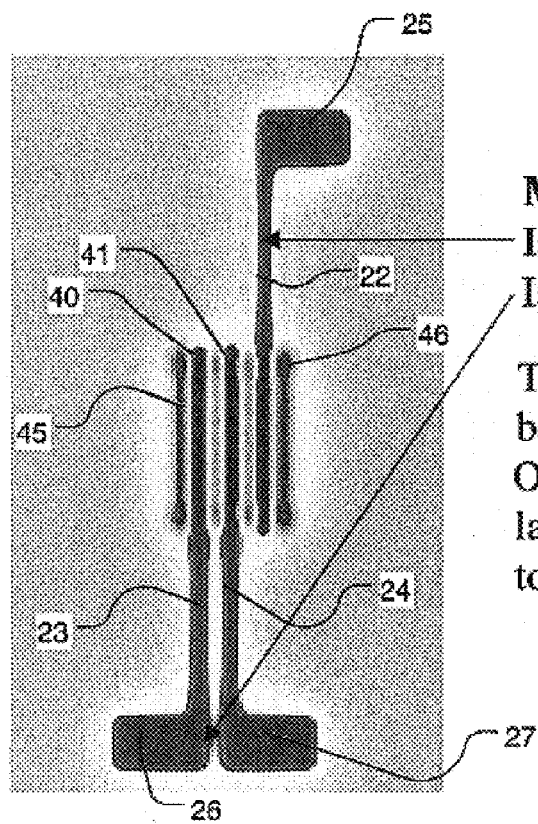
FIG. 7 is a plot of the intensity profile of an exposure made using the masks of FIGS. 5 and 6 according to the prior art.

FIG. 7 shows the resulting fine lines 40, 41, 42 in the active region of the layout. The long narrow lines 22, 23, 24 interconnect the fine lines 40, 41, 42 with the flag shaped elements 25, 26, 27. In FIG. 7, the regions 45 and 46 do not print, but are higher intensity regions which show dark as artifacts of black and white printing of the color image generated using a simulation program.

Issues associated with this technique include the poor quality of the image of isolated lines, such as line 22, and of the narrow spaces, such as between the flag shaped elements 26 and 27. Classical optical proximity correction techniques can be applied to improve dimensional control of these images, however such processes according to the prior art do not improve process latitude, making the structures difficult to manufacture.

Figure 8:
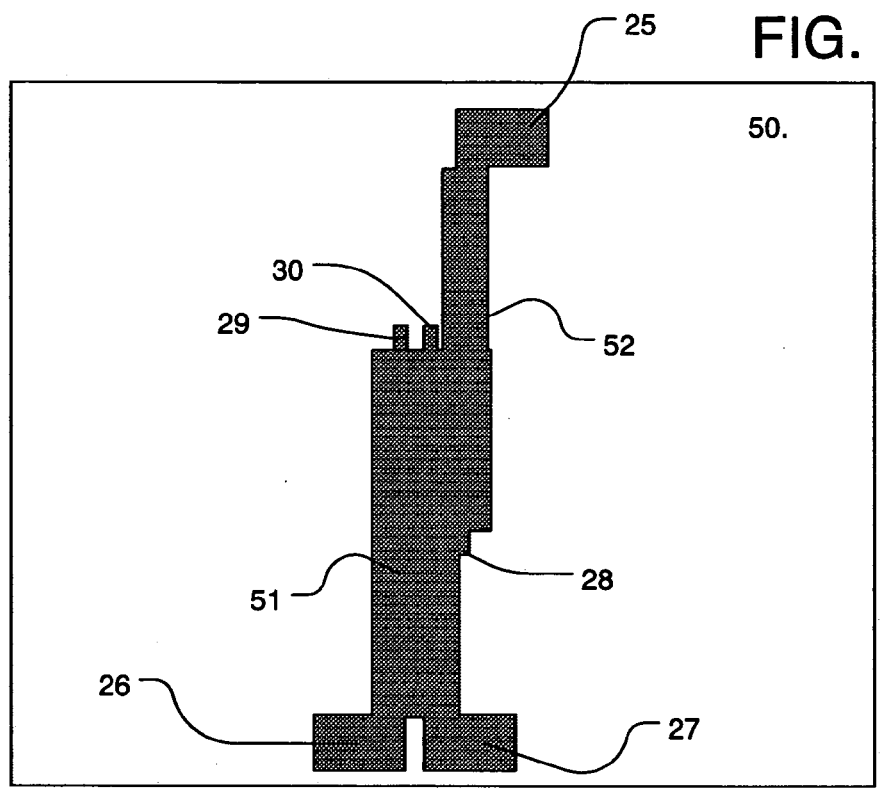
FIG. 8 illustrates a binary mask.
Figure 9:
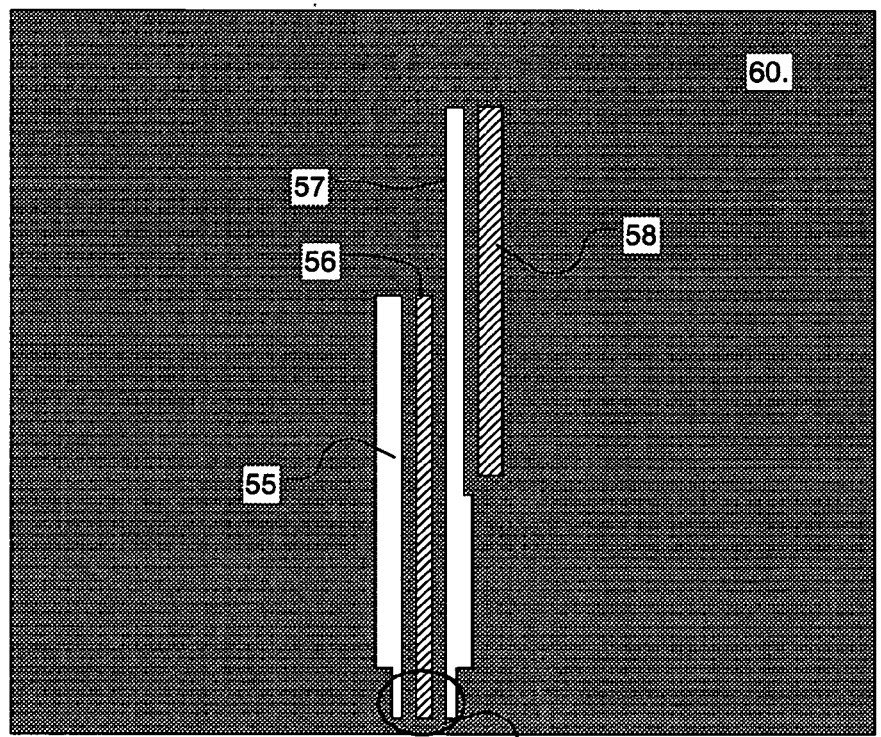
FIG. 9 illustrates a phase shift mask according to the present invention for implementing the same shape as implemented with FIGS. 1 and 2.

FIGS. 8 and 9 show the binary mask and phase shift mask implemented according to the present invention, extending phase shifting techniques to the more complex circuit pattern beyond the transistor gates in the active region. The binary mask of FIG. 8 is formed in a clear field 50. It includes blocking features 51 and 52. The pattern elements which are common with FIG. 5 have like numbers, so the extensions 28, 29, 30 and the flag shaped elements 25, 26, 27 have the same reference numbers. A corresponding phase shift mask shown in FIG. 9 includes an opaque field 60. The phase shifting windows have been extended along the entire lengths of the lines excluding the extensions 28, 29, 30 in this example. In addition, phase shifting in the window 59 is used to assist the definition of the edges of the flag shaped elements 26 and 27 in the narrow space between them. Thus, zero degree phase shift windows 55 and 57 are formed, and 180 degree phase shift windows 56 and 58 are formed. The phase shift windows 55, 56 and 57 extend to the lower edges 61, 62 of the flag shaped elements 26, 27.

Figure 10:
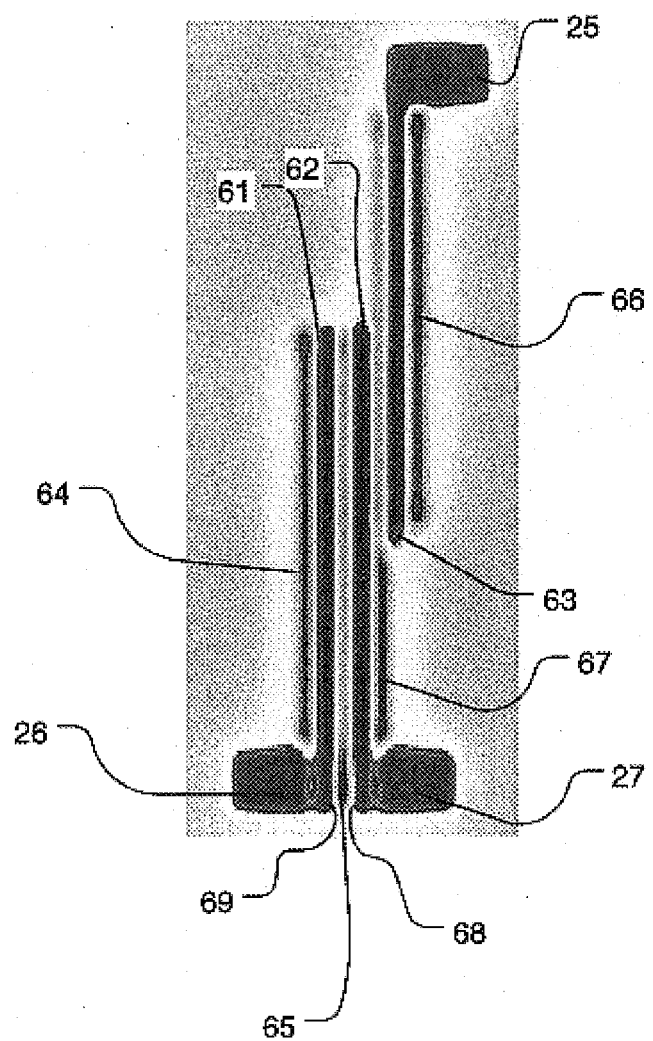
FIG. 10 is a plot of the intensity profile of an exposure made using the masks of FIGS. 8 and 9 according to the present invention.

A simulation of image resulting from application of the masks of FIGS. 8 and 9, is shown in FIG. 10, in which the regions 64, 65, 66 and 67 are nonprinting artifacts as mentioned above of the black and white printing of the color simulation image. The long lines corresponding to the lines 22, 23, 24 of FIG. 5 are printed entirely using phase shifting, so that quality, narrow dimension features 61, 62 and 63 result. The phase shifting assist feature between and on the edges of the flag shaped elements 26 and 27 results in better definition of the edges 68, 69 between the elements 26, 27. Thus, FIGS. 8–10 illustrate the application of phase shifting techniques to complex circuit pattern beyond the active regions of the device.

Figure 11:
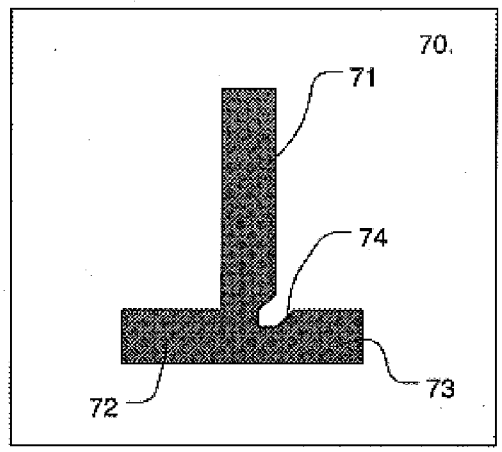
FIG. 11 is a binary mask.
Figure 12:
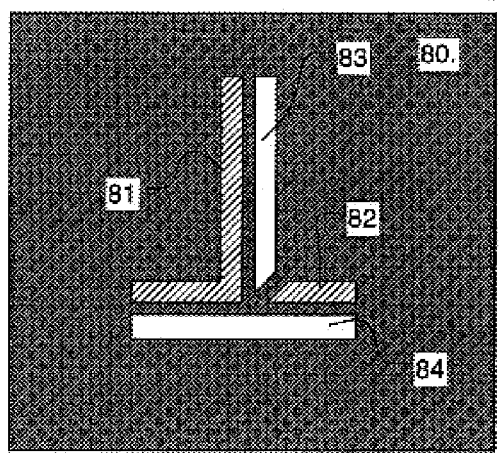
FIG. 12 is a phase shift mask for implementation of a feature comprising three intersecting line segments according to the present invention.
Figure 13:
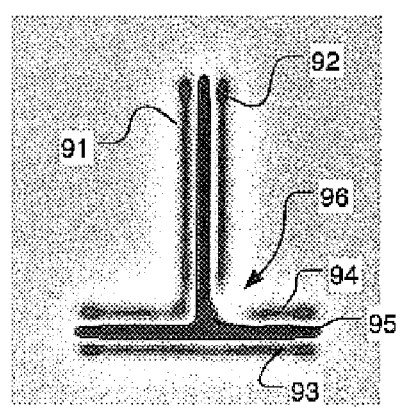
FIG. 13 is a plot of the intensity profile of an exposure made using the masks of FIGS. 11 and 12.

FIGS. 11, 12 and 13 illustrate a technique used for layout of complex structures comprising an odd number of intersecting line segments using phase shift masking. FIG. 11 shows a binary mask in a clear field 70 comprising an opaque feature 71 corresponding to a first of intersecting line segments, an opaque feature 72 corresponding to a second of the intersecting line segments, and an opaque feature (region 73) corresponding to a third of the intersecting line segments. A corner cut-out region 74 is formed according to present technique is described further below. FIG. 12 shows a phase shift mask in an opaque field 80 for formation of the intersecting line segments, and for use in combination with the complementary mask of FIG. 11. The phase shift mask includes 180 degree phase shift window 81, 180 degree phase shift window 82, zero degree phase shift window 83, and zero degree phase shift window 84. As can be seen, the 180 degree phase shift window 81 extends adjacent the line segments corresponding to the regions 71 and 72 and around the corner between regions 71 and 72. Also, the zero degree phase shift window 84 extends adjacent to line segments (region 72 and region 73) and through the "corner" formed by the 180 degree angle in the intersection of the two line segments. The phase shift windows 82 and 83 extend along the line segment 73 adjacent one side of the corner and along the other side 71 of the corner, respectively and have opposite phases. An opaque feature is laid out in the corner between the two phase shift windows 82 and 83. The cut-out feature 74 in the binary mask of FIG. 11 tends to expose the artifact which would be created by the phase transition in the corner between phase shift windows 82 and 83.

FIG. 13 shows the simulation of the image printed using the phase shift mask of FIG. 12, with a binary mask of FIG. 11. The features. 91, 92, 93 and 94 are nonprinting artifacts of the simulation program. The "T" shaped feature 95 results from the phase shift masking technique with corner cutting. As can be seen, the narrow lines are formed with relatively uniform thickness and straight sides. In the corner 96 which corresponds to the cut-out feature 74 of FIG. 11, the feature 95 is slightly less sharp than in the other corners. The shape of the printed corner could be improved by applying some correction to the cut-out 74 and the phase shift windows 82 and 83.

Figure 14:
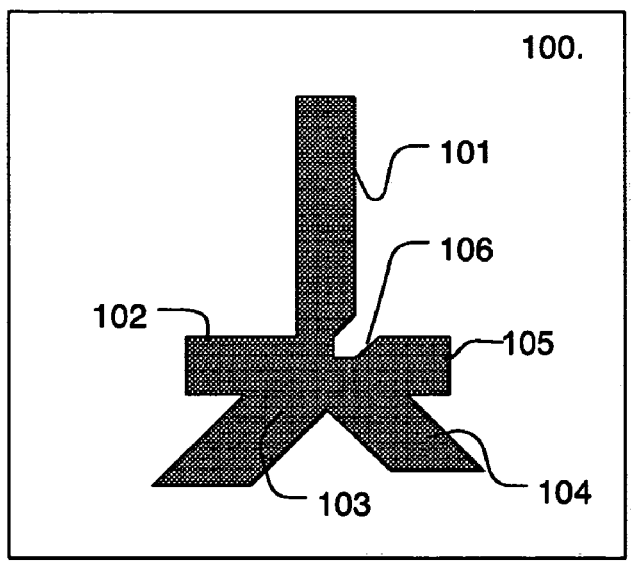
FIG. 14 is a binary mask.
Figure 15:
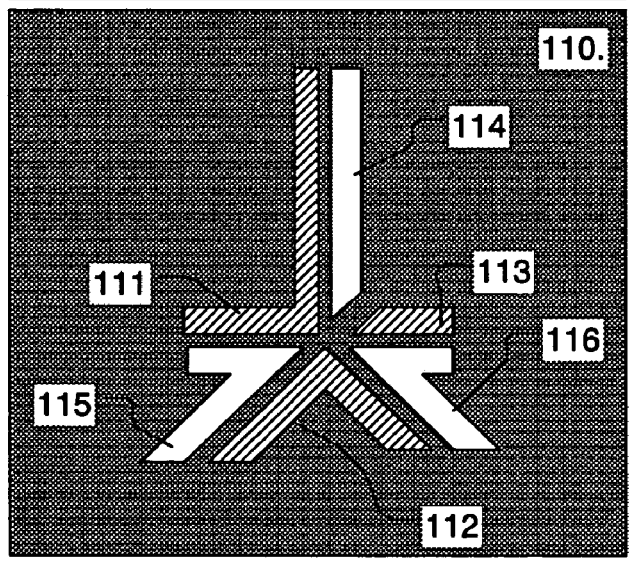
FIG. 15 is a phase shift mask for implementation of a feature comprising five intersecting line segments according to the present invention.

FIGS. 14 and 15 illustrates the "corner cutting" technique as applied to a structure comprising five intersecting line segments. Thus, FIG. 14 shows a binary mask 100 including an opaque feature having blocking structure 101 corresponding to a first line segment, blocking structure 102 corresponding to a second line segment, blocking structure 103 corresponding to a third line segment, blocking structure 104 corresponding to the fourth line segment, and blocking structure 105 corresponding to the fifth line segment. A corner cut-out feature 106 is formed between the blocking structures 101 and 105, e.g. between the line segments.

FIG. 15 shows the phase shift mask for use in combination with the binary mask of FIG. 14. The phase shift mask of FIG. 15 is formed in an opaque field 110. 180 degree phase shift windows 111, 112 and 113 are laid out in an alternating fashion as shown FIG. 15. Zero degree phase shift windows 114, 115 and 116 are laid out in a complementary fashion to define the five intersecting line segments. An opaque feature is formed between the phase shift windows 114 and 113. The artifact which would be created by the phase transition between the phase shift windows 113 and 114 is exposed by the cut-out 106 in the binary mask of FIG. 14. In addition, the shape of the opaque feature in the phase shift mask between the phase shift windows 113 and 114 can be modified and the shape of the cut-out 106 can also be optimized using optical proximity correction techniques to improve that resulting image.

A structure and a process for controlling phase mismatches on inside corners of complex structures is provided. Inside corner cut-outs are formed on the binary masks to block artifacts of phase transition in the corner, and phase shift windows are adjusted by dividing them into first and second phase shift windows of opposite phase, and reshaping them on inside corners to accommodate and optimize the effects of the inside corner extensions. The corners at which the extensions are applied can be simply decided by applying them to all inside corners, when shapes of the corners are not critical. Alternatively, the corner extensions can be applied only in one corner of a structure having an odd number of intersecting segments. The corner is picked, for example, by selecting an inside corner having the greatest distance from an active area on the device, or an inside corner having a largest angle less than 180 degrees.

The selection of corners for the phase mismatch extensions may affect the assignment of zero and 180 degree phase shift regions. Thus it may be desirable to select the corners for inside corner extensions prior to "coloring" the layout with phase assignments. A first approach to avoiding the corner conflicts is simply to select the phase shift areas in a manner that does not cause a conflict. Of course this is not always possible. Next, the conflicts can be left in regions on the chip where the design rules will tolerate the artifacts caused by the phase mismatch. In one example process, the corner extensions are applied on all inside corners, then the layout is colored to assigned phases, and then corners are rebuilt with optimized shapes. Alternatively, simplified phase assignment can be utilized when all corners are provided with phase mismatch extensions.

Figure 16:
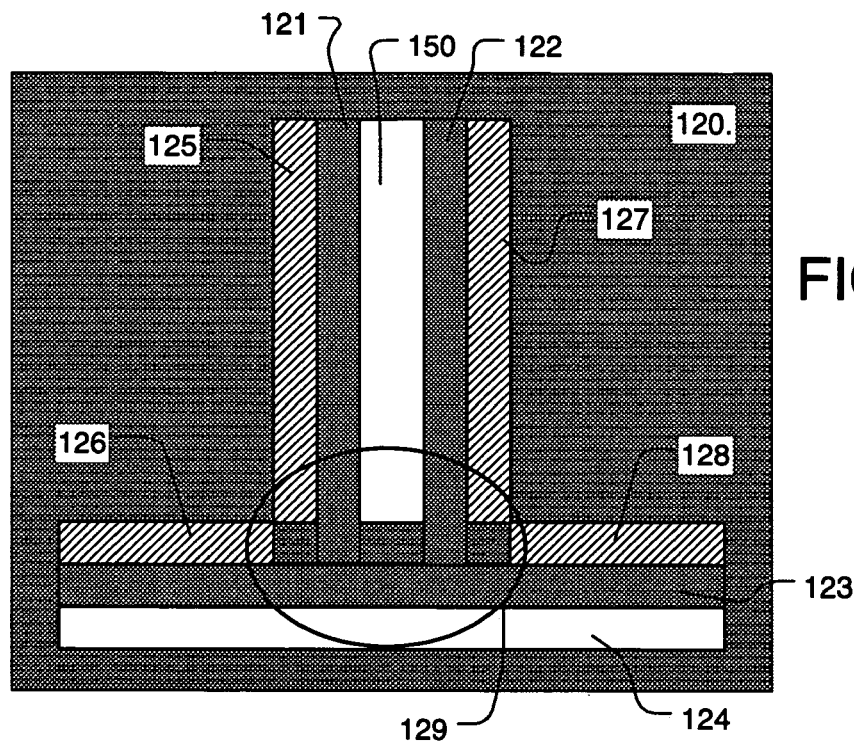
FIG. 16 illustrates a phase shift mask for implementation of a double "T" structure.
Figure 17:
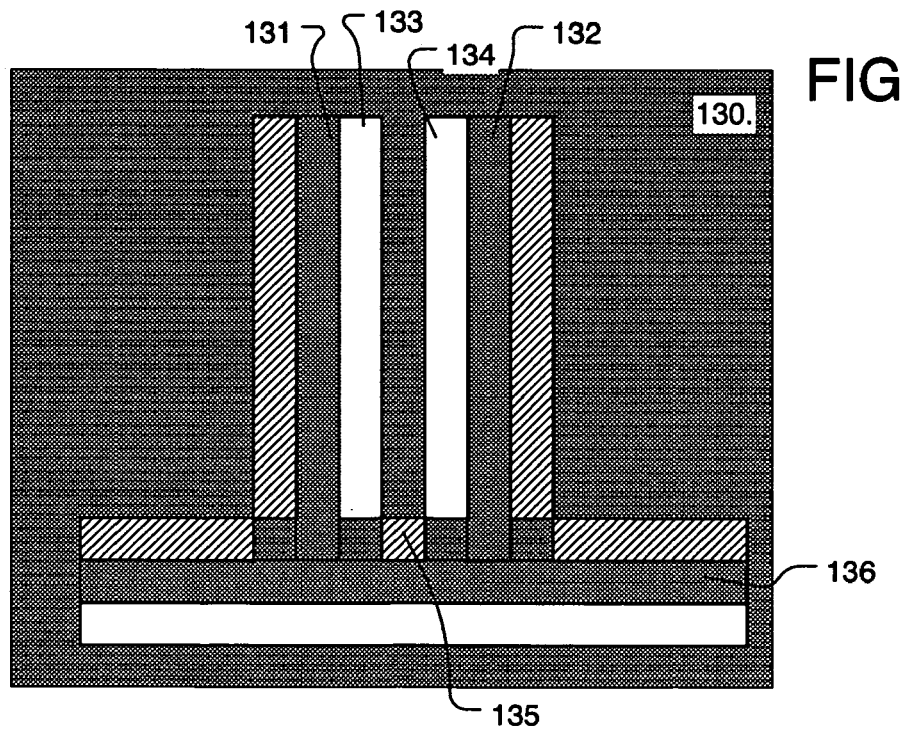
FIG. 17 illustrates an alternative phase shift mask for implementation of a double "T" structure according to the present invention.

FIGS. 16 and 17 illustrate problems encountered in the layout of a so-called double "T" structure. In FIG. 16, a phase shift mask in an opaque field 120 is shown for forming a double "T" structure having vertical line segments 121 and 122 intersecting with horizontal line segment 123. Vertical line segments 121 and 122 are close together, so a single phase shift window 123 is formed between them. In this case, phase shift window 150 is a zero degree phase shift region. Phase shift window 124 beneath the line segment 123 is also a zero degrees phase shift window creating a phase conflict in the region 129 between the vertical line segments 121 and 122. 180 degree phase shift windows 125, 126, 127 and 128 are formed along the line segments in the corners as shown. The shapes of windows 125, 126, 127, 128 have not been optimized in the corner in this example. The phase shift windows do not extend to all the way to the intersection of the line segments in this example. The phase mismatch in the region 129 can result in an aberration image such that the quality of the line segments in that region is reduced. The assumption is that the distance between 121 and 122 is small enough that the printing of the region 129 will not be critical.

FIG. 17 illustrates a double "T" structure with vertical line segments 131 and 132 formed in an opaque field 130. In this case, separate phase shift windows 133 and 134 are formed between the vertical line segments 121 and 122. A 180 degree phase shift window 135 is formed between them along the horizontal line segment 136. This resolves the phase mismatch which would have occurred with the zero degrees shift window 137 according to the structure of FIG. 16, and allows for higher quality printing of the images. In this case, the corner cutting technique utilizes simple square shape opaque features in the corners, rather than the diagonal shape shown in FIGS. 12 and 15. The square shape of FIGS. 16 and 17 may be simpler to implement using a layout program in a processor with more limited power.

Figure 18:
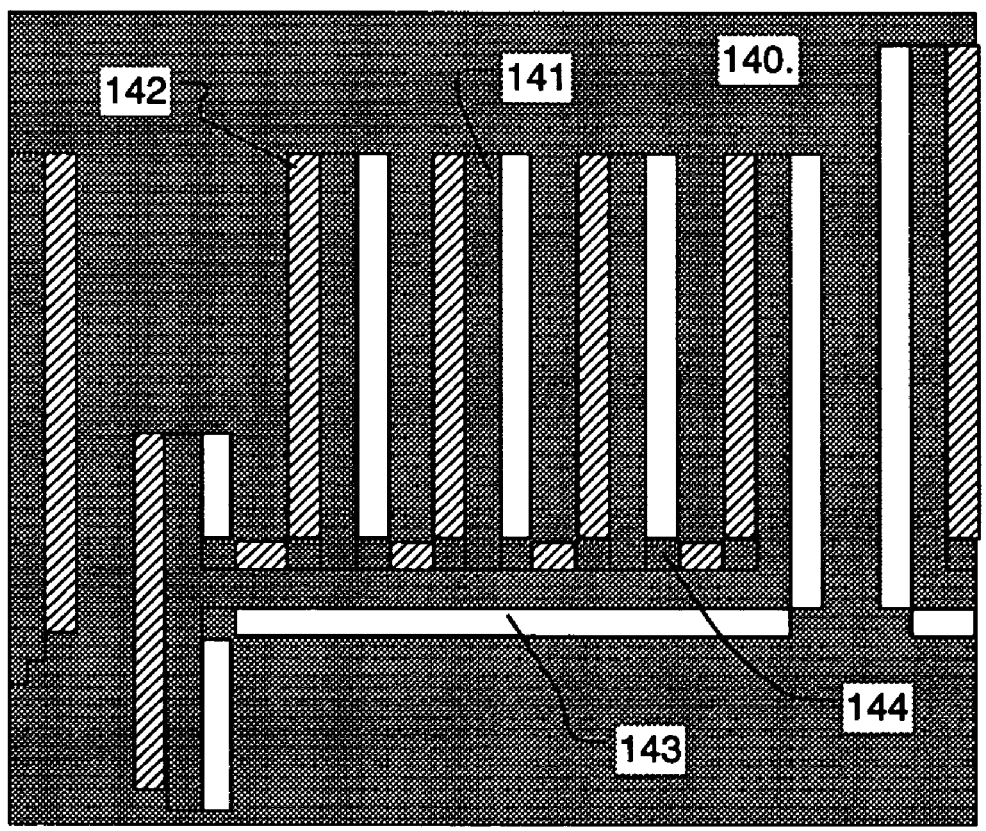
FIG. 18 illustrates one example of the layout of a phase shift mask according to the present invention for a complex pattern.

FIG. 18 provides a close-up of a portion of the layout 140 of a phase shift mask in an opaque field for a layer of an integrated circuit structure. As can be seen, a comb shaped structure 141 is formed with zero degree phase shift windows (hatched, e.g. window 142) generally on the upper and left and 180 degree windows (clear, e.g. region 143) generally on the lower and right. All inside corners are blocked with square opaque features (e.g. feature 144) in this example to minimize phase conflicts.

The generation of phase shift masks for a complex structure is a nontrivial processing problem. Automatic assignment of phase shift windows, and addition of optical proximity correction features and corner features for preventing phase shift mismatches as described above are provided in this example to facilitate processing. Three stages in the generation of phase shift mask layouts according to the process which is implemented using a design rule checking programming language (e.g. Vampire™ Design Rule Checker provided by Cadence Design Systems, Inc.) as follows:

Definition of the Input Layers:

L13=layer (13 type (0))

L13 is the original poly layer

L12=layer (11 type (0))

L12 is the original poly layer shifted in the x and y direction by 0.02 micron

Generation of the Output Layers:

L2=geomSize (L13 −0.01 edges)

size L13 by −0.01 only edges (inner corners are not moved)

L2_1=geomAndNot (L13 L2)

L2_2=geomSize (L2_1 0.01)

L3=geomAndNot (L2_2 L13)

marker: 0.01 by 0.01 square in inner corners of L13
L4=geomSize (L13 0.01)
L5=geomSize (L13 0.01 edges)

size L13 by 0.01 only edges (outer corners are not moved)
L5_1=geomAndNot (L4 L5)
L6=geomAndNot (L5_1 L13)

marker: 0.01 by 0.01 square at the tips of outer corners
L6_1=geomSize (L6 0.14)
L6_2=geomSize (L13 0.15 edges)
L6_3=geomAndNot (L6_1 L6_2)
L6_4=geomSize (L6_3 0.14)
L6_5=geomSize (L6_4 −0.14)

merges any 0.28 and below gaps
L6_6=geomSize (L6_5 −0.02)
L6_7=geomSize (L6_6 0.02)

removes any 0.04 and below geometries
L7=geomAndNot (L6_7 L13)
L7=layer to be removed from phase layer to cut the outer corners
L3_1=geomSize (L3 0.15)
L8=geomAndNot (L3_1 L13)
L8=layer to be removed from phase layer to cut the inner corners
L8_1=geomOr (L7 L8)

add together the layers to be removed from the phase layer
L8_2=geomSize (L13 −0.1)
L8_3=geomSize (L8_2 0.1)

removes any 0.2 micron and below geometries
L8_4=geomAndNot (L13 L8_3)

L13 without geometries larger than 0.2 micron
L9=geomSize (L8_4 0.15)
L9_1=geomAndNot (L9 L8_1)
L9_2=geomAndNot (L9_1 L13)
L9_3=geomSize (L9_2 −0.03)
L10=geomSize (L9_3 0.03)

−0.03/0.03 to remove any geometry below 0.06 micron
L10=phase shifter layer (no coloring performed)
L11=geomOverlap (L10 L12)

0 degree phase-shift layer
L14=geomAndNot (L10 L11)

180 degree phase-shift layer

A design rule checker can be utilized to identify all exposed features (i.e. lines) and unexposed features (i.e. spaces between lines) of an input layout that have a size less than a minimum feature dimension. Features subject of the minimum feature dimension may constitute structures or spaces between structures. Different minimum feature dimensions are applied to lines and to spaces in one embodiment. Thus, minimum feature structures can be identified by subtracting slightly more than ½ of a minimum feature dimension for lines from the original size of an input structure. This results in eliminating all structures which have a dimension less than the minimum dimension. The remaining structures can then be reconstituted by adding slightly more than ½ of the minimum dimension back. Minimum dimension structures can then be identified by taking the original input structure and subtracting all structures which result from the reconstitution step. This process can be characterized as performing a size down operation to eliminate small dimension features followed by a size up operation on remaining edges to produce a calculated layout. The small dimension features are then identified performing an "AND NOT" operation between the original layout AND NOT and the calculated layout.

Narrow spaces can be identified by an opposite process. In particular, slightly more than ½ of the minimum feature dimension for spaces is added to the original size of the structure. This added length or width causes structures that are close together to overlap and merge. Next, the remaining structures are reconstituted by subtracting slightly more than ½ of the minimum feature dimension from the sides of structures remaining. Narrow regions are identified by taking the reconstituted remaining structures and subtracting all original structures. Thus, a process can be characterized as performing a size up operation to eliminate small dimension spaces, followed by a size down operation on the remaining edges to produce a calculated layout. The small dimension spaces are then identified by performing an "AND NOT" operation between the calculated layout and the original layout.

The next step in the procedure for automatic generation of phase shift mask layouts involves identifying all corners in the structure. Inside corners and outside corners are identified. Outside corners are blocked to define ends of phase shift regions. Inside corners may result in a phase mismatches discussed above. Inside corners are blocked, and thus provided with an extension of the opaque region, such as a square extension, and a shortening of the phase shift regions so that they do not extend all the way to the inside corner. This square extension is applied in all inside corners, whether a phase mismatch is found or not. Alternatively, the extension is applied only where phase mismatches occur.

Phase shift regions are formed in a simple case, by copying the input structures in the minimum dimension features, and shifting up and to the left for 180 degree (or zero degree) shifters, and down and to the right for zero degree (or 180 degree) shifters. The blocking regions formed for the outside corners cut the shifted regions at the ends of the input structures, and the blocking structures formed on the inside corners cut the shifted regions at the inside corners of the structure to provide well formed phase shift mask definitions. The phase "coloring" can be applied to the resulting phase shift regions in other ways, including manually, so that the zero and 180 degree regions are properly laid out.

The limitation of this simple technique is that the shifts in the X and Y directions need to be carefully chosen if there is any polygon at an angle different from 0 to 90°.

All inside corners are blocked in the example shown in FIG. 18. However, in a preferred system, inside corners for which no phase conflict is encountered would be filled with a phase shift region.

In another embodiment, the inside corner extensions which block phase mismatches, are not applied on inside corners adjacent active regions of devices that are near the corners, if a choice is possible. For structures having an odd number of segments intersecting, the location of the phase mismatch, and application of the corner extension, can be chosen at the angle farthest from the active regions in the device, or at the largest angle.

Once the inside corner extensions are identified, the extensions can be optimally shaped to improve the resulting exposure pattern, such as by changing the squares to diagonally shaped regions shown in FIGS. 12 and 15. Other principles of optical proximity correction can be applied to enhance the shapes of the inside corner extensions. Likewise, the phase shift regions can be shaped adjacent the inside corners to enhance performance. In one example system transitions may be enhanced between the phase shift regions by placing a 90 degree phase shift region between conflicting zero and 180 degree phase shift regions.

Figure 19A:
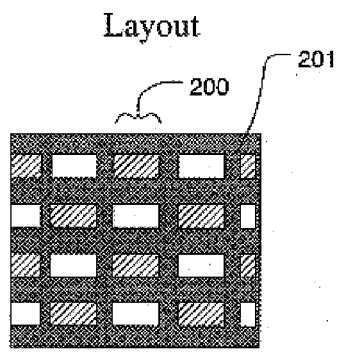
FIGS. 19A and 19B illustrate the layout and contour plots of a prior art phase shift mask for implementation of a dense array of capacitor plates on integrated circuit.
Figure 19B:
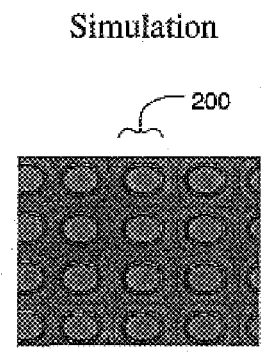

FIGS. 19A and 19B illustrate a prior art technique for laying out an array of dense shapes, such as a capacitor plate array in the layout of a dynamic random access memory device. A phase shift mask as shown in FIG. 19A is used to form the array. The phase shift mask includes a column 200 of alternating phase transparent areas within an opaque field 201. Likewise adjacent columns alternate in phase in a complementary manner as shown. This results in the printing of lines on transitions between the alternating phase shift areas and exposing regions inside the phase shift regions. FIG. 19B illustrates the simulation of the exposure pattern. As can be seen, a dense array of oval patterns is caused by the layout of FIG. 19A. For a denser array, it is desirable to make the exposed patterns more rectangular in shape.

Figure 20A:
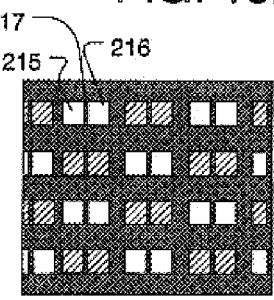
FIGS. 20A and 20B illustrate the layout and contour plots of the phase shift mask for implementation of a dense array of capacitor plates on an integrated circuit according to the present invention.
Figure 20B:
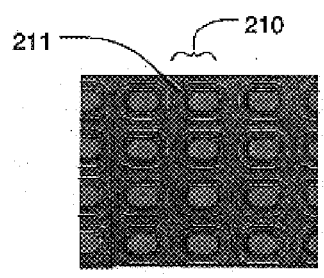

FIG. 20A illustrates an adjustment to the phase shift layout according to the present invention to make the exposed patterns more rectangular. According to this technique, the phase shift regions have been adjusted so that they consist of a first phase shift area 215 and a second phase shift area 216 having the same phase with an opaque sub-resolution feature 217 in between. Likewise, all of the phase shift windows have been split into two phase shift windows as shown with sub-resolution features in between. Note that the assist feature which divides the phase shift region is not necessarily smaller than the phase shift region. Lines are printed at the phase transitions, and the sub-resolution features between the like-phase regions do not print. The resulting pattern is shown in FIG. 20B, where the exposure shows features having much straighter sides and covering much greater area than those of FIG. 19B. In the simulation plot of FIG. 20B, the dark outlines, such as line 211 within the column 210 of exposed areas, illustrate the final contour of the exposed region. Thus, a technique for improving the images which result from use of phase shift areas involves adjusting a phase shift area having a particular phase into a first phase shift area and a second phase shift area having the same particular phase and adding a sub-resolution feature in between.

Figure 21:
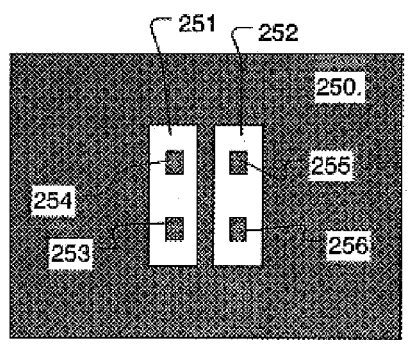
FIG. 21 illustrates a phase shift mask having sub-resolution assist features, for implementation of an exposure pattern as shown in FIG. 22.
Figure 22:
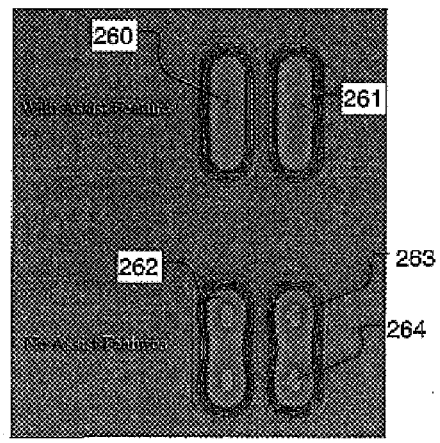
FIG. 22 shows an exposure pattern which results from the phase shift mask of FIG. 21, and an exposure pattern which would result from the phase shift mask of FIG. 21 without the assist features.

FIGS. 21 and 22 illustrate the use of sub-resolution features within the phase shift regions according to another technique of the present invention. In FIG. 21, an opaque field 250 is shown with a first phase shift region 251 and a second phase shift region 252 having an opposite phase. Sub-resolution assist features 253 and 254 are formed within the phase shift region 251. Sub-resolution assist features 255 and 256 are formed within the phase shift region 252. As can be seen, the phase shift regions 251 and 252 have respective perimeters. The sub-resolution assist features 253, 254, 255, 256 are inside of the phase shift regions and do not contact the perimeters in this example.

FIG. 22 shows simulation of the exposure patterns resulting from the phase shift mask of FIG. 21. In the top, images 260 and 261 are shown which correspond to the use of the phase shift mask of FIG. 21. Images 262 and 263 correspond to the use of the phase shift mask of FIG. 21, without the sub-resolution assist features 253–256. As can be seen, with the sub-resolution assist features 253–256, the lines are much straighter and the exposure patterns are much more uniform. According to one technique, the sub-resolution features are placed within the phase shift regions by first simulating the exposure patterns without the sub-resolution assist features. Hot spots, such as hot spot 264 in the simulation image 263 or other anomalies, are identified. Sub-resolution features are then placed over the anomalies. Thus, sub-resolution feature 255 corresponds to the hot spot 264.

Figure 23:
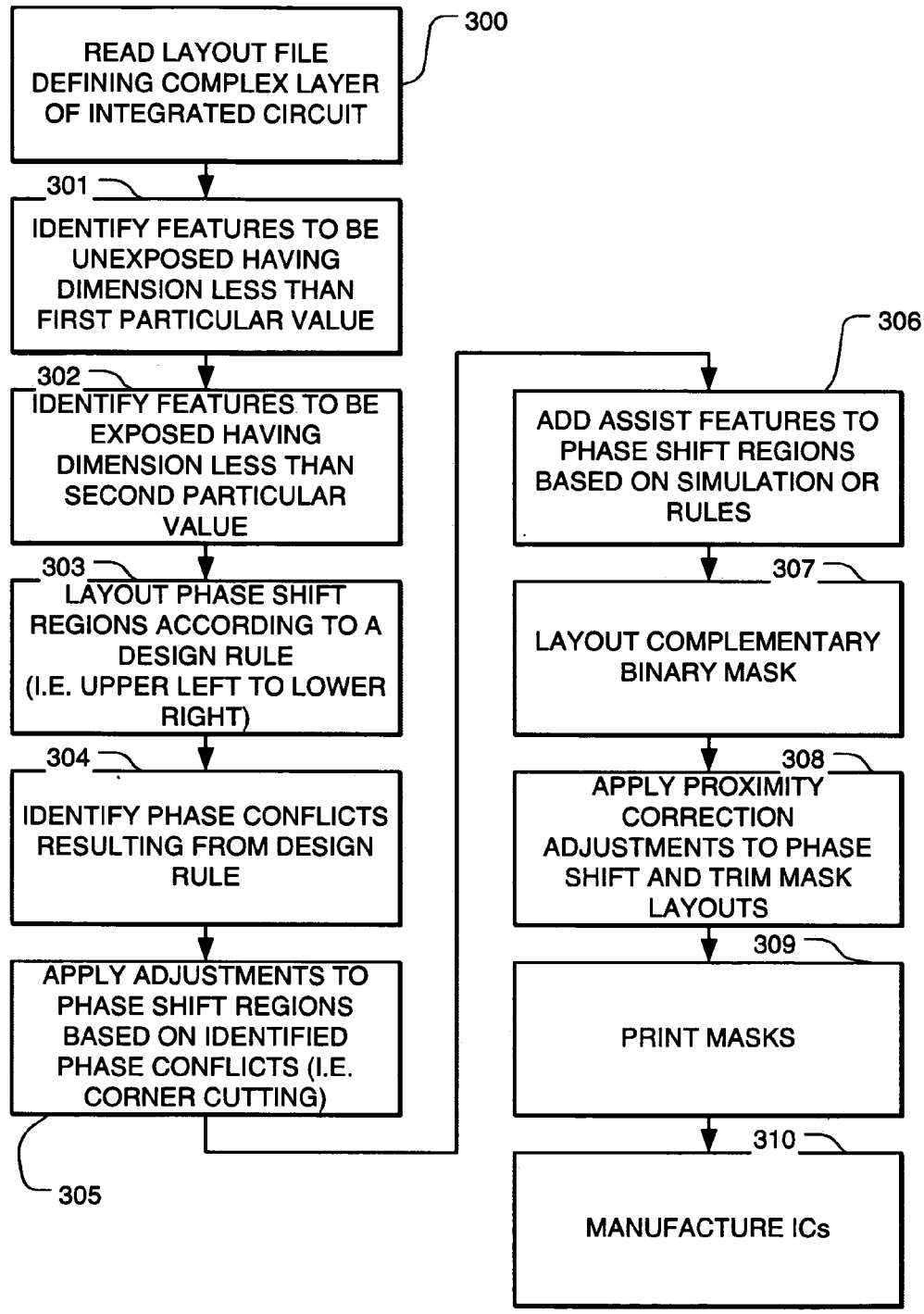
FIG. 23 is a flow chart of a process for producing layout files, and phase shift mask and manufacturing integrated circuits according to the present invention.

The techniques for improving phase shift masking for complex layouts outlined above are combined into a process for producing phase shift layout data and manufacturing phase shift masks for complex layouts, as shown in FIG. 23. The process is also extended to the manufacturing of integrated circuits with improved structures. Thus, according to the present invention, the manufacturing process involves reading a layout file which defines a complex layer of an integrated circuit (step 300). For example, in one embodiment the layer comprises polysilicon or another conductive material used as transition gates and interconnect structures. Next, features to be left unexposed by the mask are identified which have a dimension less than a first particular value (step 301). Then, features to be exposed and having a dimension less the second particular value are identified (step 302). The first and second particular values may be the same value or different, as suits the particular implementation.

Next, the process involves laying out phase shift regions for the identified features according to a design rule (step 303). One example design rule involves laying out phase shift regions having a zero degree phase (or 180 degree phase) to the upper left, and a phase shift regions having the opposite phase, such as 180 degree phase (or zero degree phase) to lower right. This simple phase shift layout rule results in phase conflicts, where adjacent phase shift regions have the same phase so phase transitions do not occur. Any other phase assignment technique can be used. The phase conflicts are identified in a next step (step 304). Adjustments are applied to the phase shift regions based on identified phase conflicts (step 305). For example, the corner cutting technique described with respect to FIGS. 11–15 is applied. In a next step, the exposure pattern is simulated and assist features are added to the phase shift regions based on the simulation (step 306). Rather than using simulation for placement of sub-resolution assist features, the locations of the subresolution features can be determined based on design rules. For example, one design rule is to place a 0.1 μm square assist feature, 0.2 μm away from the edge of the phase shift region. Thus, phase shift regions may be adjusted using sub-resolution assist features within the perimeter of the phase shift region, or by dividing the phase shift region as described with reference to FIGS. 20A and 21.

A complementary trim mask is then laid out, including the corner cut-outs as necessary for intersecting line segments and the like (step 307). In a next step, other optical proximity correction techniques are applied (in this stage of the process, or after the complementary trim mask layout is provided) and the phase shift mask layout is completed (step 308). In a preferred embodiment, proximity correction techniques as described above with respect to FIGS. 1–4, are applied to the phase shift mask layout and the complementary trim mask layout, using one of rule based and model based correction approaches. In addition, serifs can be added to corners, line sizes can be adjusted, hammerheads can be added, phase shift areas can be sized, and assist opaque bars may be added to phase shift areas, using proximity correction modeling and/or rule based techniques.

With the completed phase shift and complementary mask layouts, the masks are printed using techniques known in the art (step 309). See, U.S. Pat. Nos. 6,096,458; 6,057,063; 5,246,800; 5,472,814; and 5,702,847, which provide background material for phase shift mask manufacturing. Finally, integrated circuits are manufactured using the resulting phase shift masks (step 310).

Overall, the embodiments described provide a solution for applying phase shift masks extensively in integrated circuit layouts. This provides for shrinking entire layouts or significant portions of layouts. The process involves first identifying features using a computer program to define any features that have a dimension which is smaller than a specified minimum dimension. Also, the process is applied to identify spaces between features which are smaller than a minimum dimension. The minimum dimension for spacing may be different than the minimum dimension for structures. After detection of features smaller than a minimum dimension, phase shift regions are assigned. Non-printing phase shift regions can be used for providing greater contrast in narrow isolated spaces. Inside corner extensions to block phase conflicts are added where necessary. Complementary trim masks are generated using established techniques. Finally, one or both of proximity correction modeling, or proximity correction rules, are used to optimize the shapes being implemented.

Embodiments of the invention also provides techniques for applying phase shifting to specific shapes, such as "T" shapes, "Y" shapes, "U" shapes and "double T" shapes.

Figure 24:
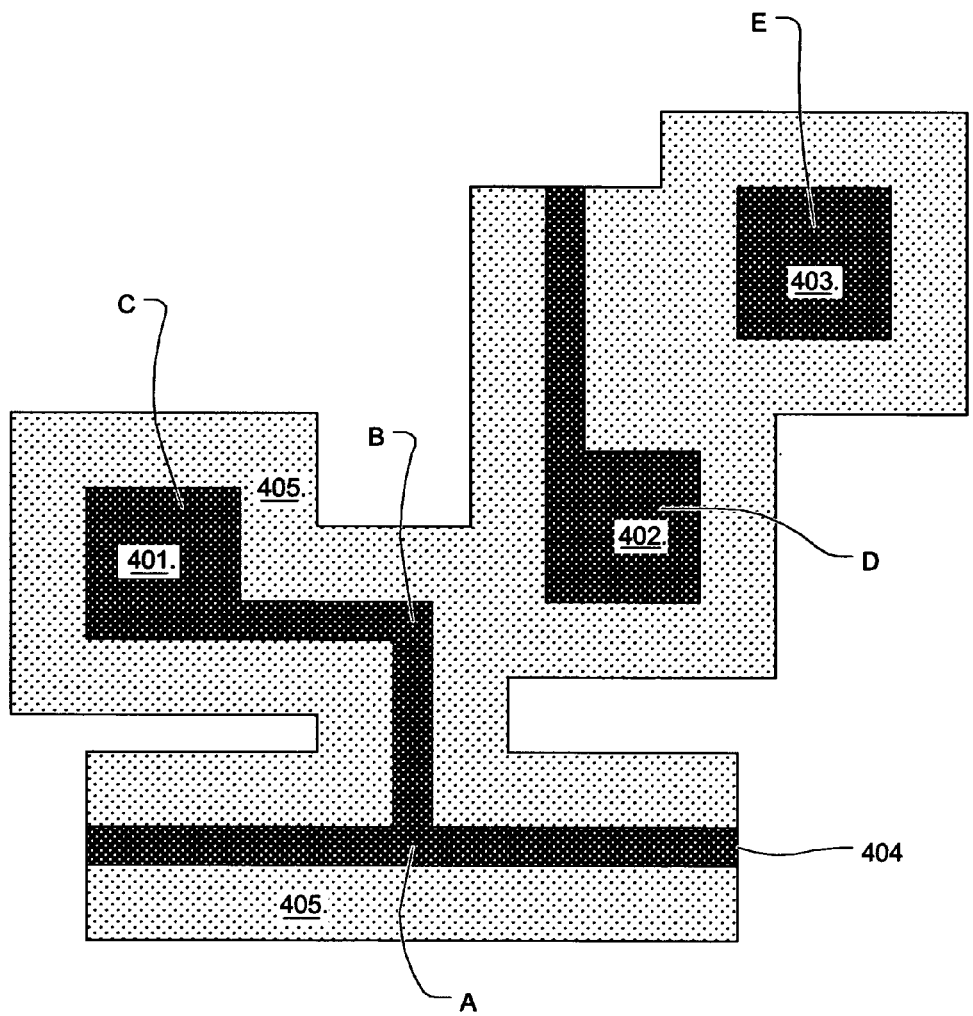
FIG. 24 illustrates a complex pattern of features, and phase shift regions for defining the features using a "full shift" technique according to the present invention, prior to cutting the phase shift regions into phase shift windows and assigning phase shift values to the phase shift windows.
Figure 25:
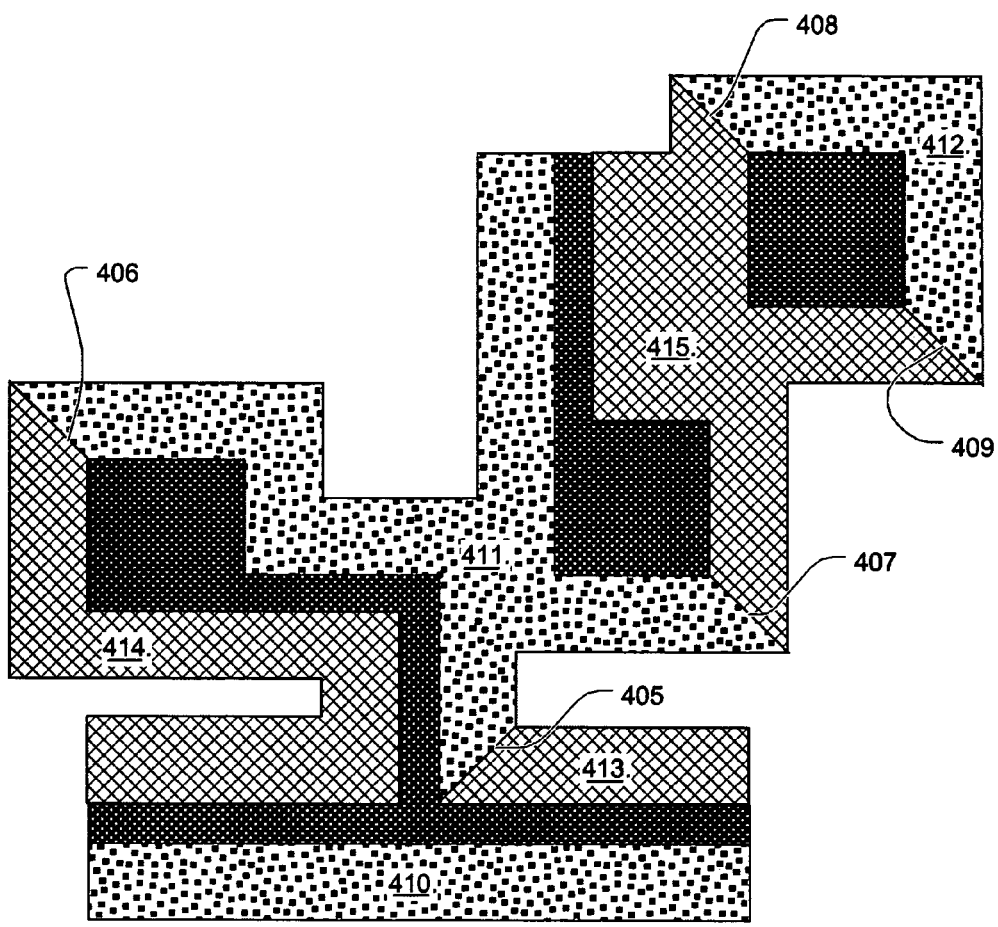
FIG. 25 illustrates the pattern of FIG. 24, after cutting the phase shift regions into phase shift windows and assigning phase shift values to the phase shift windows.

Further aspects of the layout of complex patterns using phase shift masking can be understood with reference to FIGS. 24 and 25. In FIG. 24, a pattern that includes a plurality of features in the three opaque regions 401, 402 and 403 is shown. For a "full shift" implementation of a mask for creating the pattern, phase shift regions 405 are laid out by forming boundaries of the phase shift regions parallel with the sides of the opaque regions 401, 402, 403 with the exception of the ends of narrow lines, such as the line end 404. The problem solved by the present invention is to create phase shift windows in the phase shift regions for an alternating phase shift mask to implement the three opaque regions 401, 402, 403. Thus, one must decide where to cut the phase shift regions 405 to form the phase shift windows, without creating phase conflicts, with as few cuts as practical.

According to the present invention, non-critical features in the pattern are identified first. Such features in this example include T-shaped features such as the feature A, elbow shaped features such as the feature B, and large polygons such as the features C, D, and E. Also, field areas outside the phase shift regions are identified. Potential cutting areas are determined based on these characteristics of the pattern, so that the phase shift region should be cut along lines between non-critical features, or along lines between a non-critical feature, and a field area that is outside the phase shift region. Furthermore, the phase shift regions should not be cut along lines which intersect narrow fields, having lesser process latitude, as explained in more detail below.

FIG. 25 shows one example layout of the phase shift windows for the pattern of FIG. 24, where the phase shift region is cut along a line 405 from the non-critical feature A to the field, along a line 406 from the non-critical feature C to the field, along a line 407 from the non-critical feature D to the field, along a line 408 from the non-critical feature E to the field, and along a line 409 from the non-critical feature E to the field. As a result, phase shift windows 410, 411, 412 are created and assigned a phase value of θ, and phase shift windows 413, 414 and 415 are created and assigned a phase shift value of φ, where φ is equal to approximately θ+180 degrees, so that desired destructive interference occurs for definition of the desired pattern. In the context of an alternating phase shift mask, it is preferred that φ be close to 180 degrees plus θ, such as within plus or minus 10 degrees. Other phase shifting techniques may apply other combinations of phase values, or require stepped phase values so that more than two phase values are used.

The problem of selecting the locations of the cuts to create the phase shift windows is extremely complex, because the large numbers options for locating the cuts. The identification of a bound number of cutting areas based on features of the pattern, as taught by the present invention significantly simplifies this problem.

Figure 26:
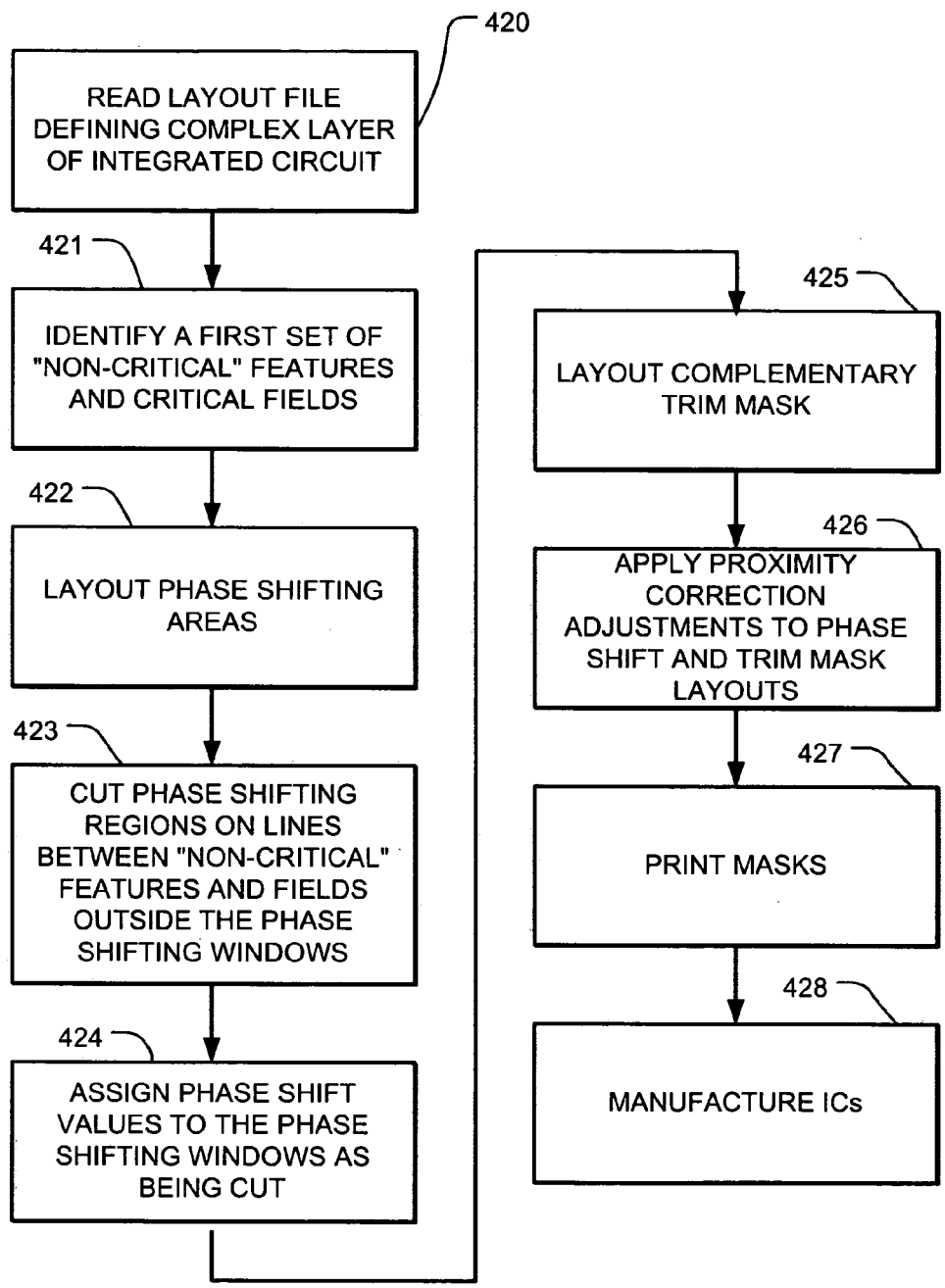
FIG. 26 is a simplified flow chart illustrating a process for defining a phase shift mask, manufacturing the mask and manufacturing integrated circuits according to present invention.
Figure 27:
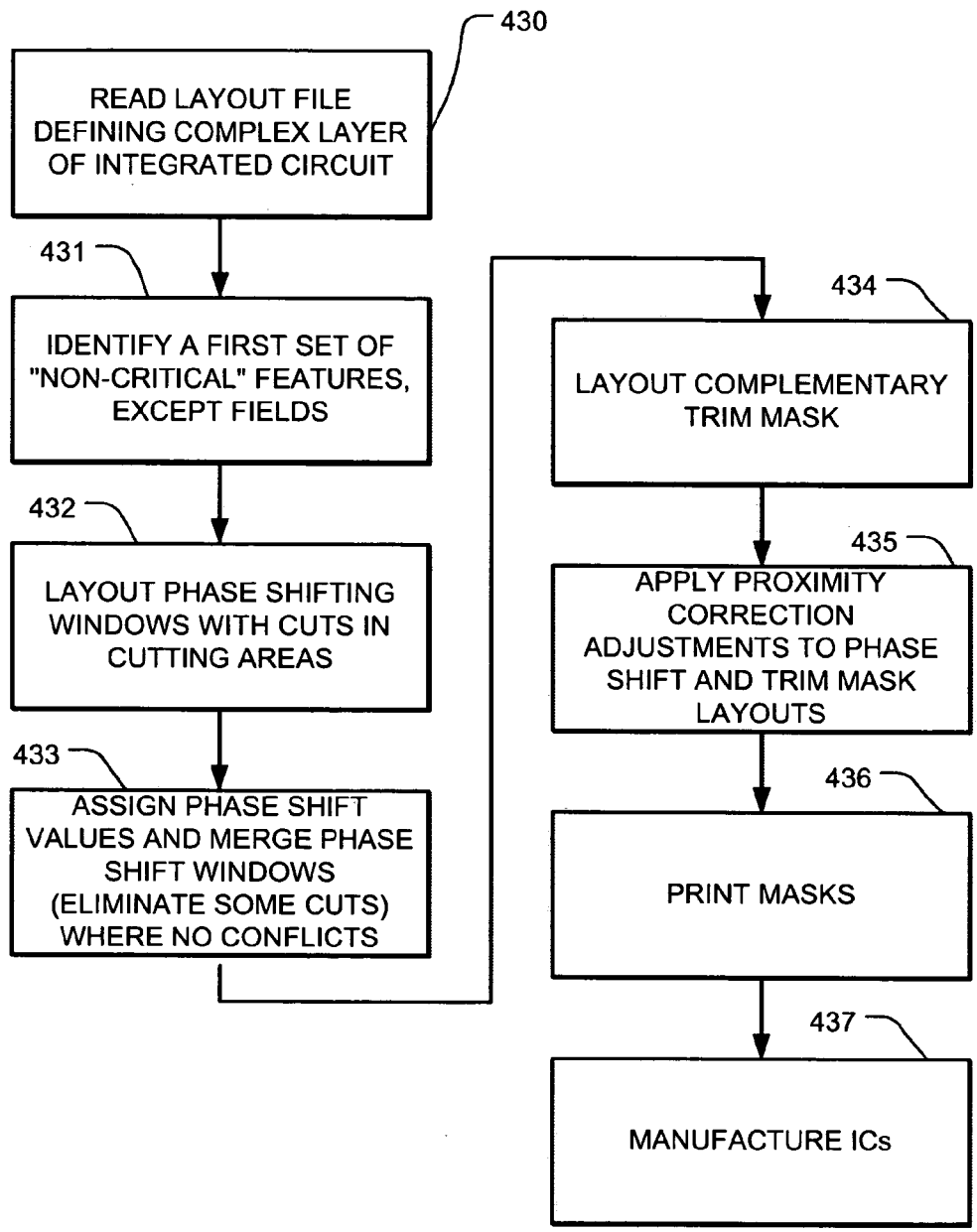
FIG. 27 is a simplified flow chart illustrating an alterative process for defining a phase shift mask, manufacturing the mask and manufacturing integrated circuits according to present invention.

FIGS. 26 and 27 illustrate alternative approaches to the phase shift window cutting and phase value assignment solution of the present invention. As shown in FIG. 26, the process begins by reading a layout file defining a complex layer of an integrated circuit, or other work piece (block 420). A software algorithm is applied to identify "non-critical" opaque features, which are characterized by greater process latitude (block 421). Also in the step represented by block 421, "critical" fields are identified which are characterized by lesser process latitude. Next, phase shift regions are laid out around the pattern, which are to be cut into phase shift windows (block 422). Cutting areas are identified based upon the features of the pattern, and the phase shift regions are cut on lines between "non-critical" features, or between a non-critical feature and a field, including fields near line ends, without intersecting so-called "critical" field regions (blocks 423 and 424). A complementary trim mask is defined as known in the art, which for an opaque background phase shift mask, trims line ends and unwanted artifacts created by the transitions between phase shift windows that are not part of the pattern to be formed on the layer, and optionally defines other features in the layer (block 425). After the phase shift windows and trim layout are defined, optical proximity correction techniques are applied to complete a phase shift mask layout (block 426). The phase shift masks are printed (block 427), and integrated circuits are manufactured using the masks to complete the manufacturing process (block 428).

FIG. 27 illustrates an alternate flow for the process. The flow of FIG. 27 likewise begins by reading a layout file defining a complex layer of an integrated circuit, or other work piece (block 430). A software algorithm is applied to identify "non-critical" features, which are characterized by greater process latitude (block 431). Also in the step represented by block 431, "critical" fields identified which are characterized by lesser process latitude. Next, preliminary phase shift windows are laid out adjacent features that have lesser process latitude than the "non-critical" features, with cuts in cutting areas (block 432). Next, phase shift values are assigned, and the preliminary phase shift windows are merged to form final phase shift windows, by eliminating some cuts (block 433). Thus, rather than beginning with a unified phase shift region as shown in FIG. 24, a plurality of small preliminary phase shift windows is used for the starting position for this process flow. Using either flow, cutting areas are defined and final cuts are selected in cooperation with the process of assigning phase shift values to the resulting phase shift windows. A complementary trim mask is defined as known in the art (block 434). Proximity correction techniques are applied to complete a phase shift mask and trim mask layout (block 435). The phase shift masks are printed (block 436). Integrated circuits are manufactured using the masks to complete the manufacturing process (block 437).

The "non-critical" features of the pattern can be understood with reference to FIG. 28, which is a printout of a simulation formed using over exposure conditions. The features of the pattern which remain unexposed according to the simulation are identified by contour lines (e.g. line 440) around darker regions in the printout. These unexposed features correlate with the "non-critical" opaque features which are used for the purposes of the present invention to identify cutting areas for the phase shift windows in the layout problem. For example, non-critical areas can be areas that are left over after an over exposure of about 20 percent from a nominal dose and de-focus at the edge of the focus latitude window for example of about 0.3 micron. The simulation process can also be used to determine parameters that can be used with a design rule checker of layout tool to identify the "non-critical" features using a software algorithm analyzing the machine readable layout. The parameters used by such tools can also be determined by trial and error, or by simply applying knowledge of persons skilled in the art.

It can be seen that non-critical features comprise large polygons, any elbow or "T," and fields that are opaque in an opaque background phase shift layout, since such opaque fields will be removed during the exposure with the trim mask. Preferential cuts are made between the non-critical areas and fields near line ends, since line ends are already cut using the second level exposure, and according to other "cost function" criteria as described below.

FIG. 29 shows the layout of the pattern simulated in FIG. 28, with the non-critical features identified by diagonal hatching. The contour line 440 of FIG. 28, corresponds to the feature 441 of FIG. 29.

Figure 30:
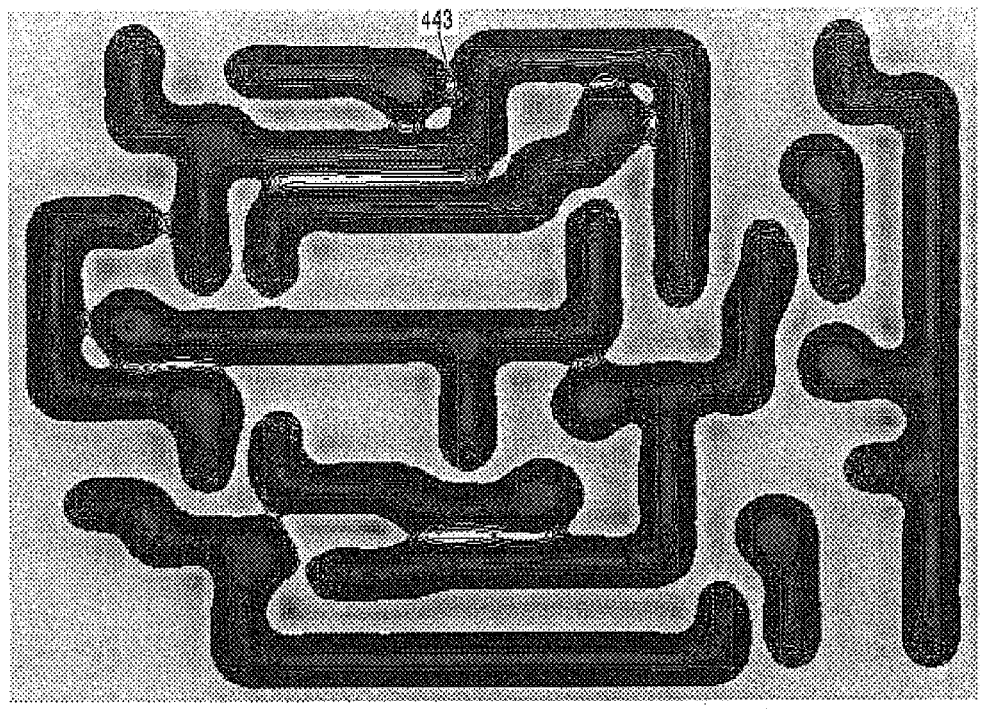
FIG. 30 is a color printout of a simulation done with under-exposure conditions which tend to identify critical field areas between features in the pattern of FIG. 28.

The definition of a critical field area can be understood with reference to FIG. 30, which shows a printout of a simulation of extreme under exposure conditions. Certain tight space areas (e.g. area 443) tend to bridge due to the under exposure between features in the pattern. Such tight space areas can be seen where the patterns are bridging in FIG. 30. For example, critical field areas can be areas bridging after an under exposure by 20 percent from a nominal dose, and the focus at the edge of the focus latitude of for example 0.3 micron. The critical field areas can also be flagged using a set of rules used in a design rule checker or layout tool for example, with the parameters determined by the simulation process, by trial and error, or by applying knowledge of persons skilled in the art. The phase shift regions should not be cut to form phase shift windows through critical field areas.

Figure 31:
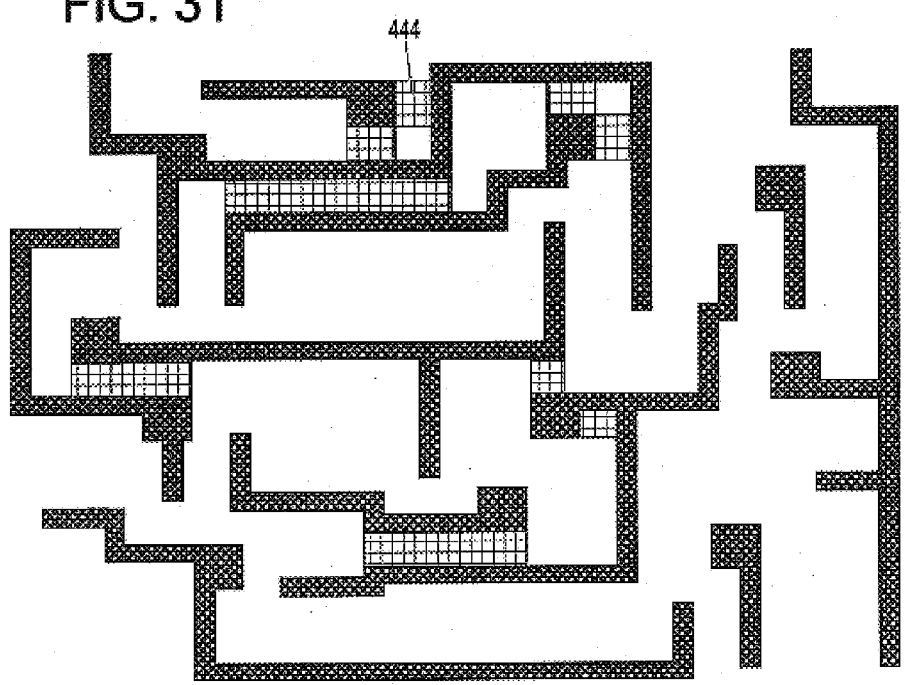
FIG. 31 shows the pattern of FIG. 28 in which critical field areas are marked.

FIG. 31 illustrates the pattern simulated in FIG. 30, with the critical space areas identified in by cross-hatching. The area 443 of FIG. 30 corresponds to the area 444 in FIG. 31.

The process of identifying cutting areas for the pattern shown FIGS. 28–31 can be understood with reference to FIGS. 32–38. In FIG. 32, phase shift regions 445 are defined surrounding the pattern shown in black, by extending lines parallel to the sides of the opaque features in the pattern and spaced away by a selected amount. Characteristics of the pattern that are to be applied in the defining of cutting areas can be seen in FIG. 33, in which the phase shift regions, the critical field areas shown in diagonal hatching, and the non-critical features of the pattern shown in cross-hatching are combined.

FIG. 34 shows a first step in the process of identifying cutting areas according to one process flow. In this step, portions of phase shift regions (e.g. portion 446) shown in square dot hatching which are to be protected from cutting in order to define the critical dimension features of the pattern are shown.

In FIG. 35, portions of the phase shift regions to be protected are extended by allowing phase shift windows adjacent to the non-critical features as well as the critical features. Thus, it can be seen that adjacent the large rectangle 450, a phase shift region 451 is protected from cutting. Other similar portions of the phase shift regions are protected from cutting as can be seen by a comparison of FIGS. 34 and 35.

In FIG. 36, the shapes of the cutting areas shown in square dot hatching are adjusted to account for T-shaped features. Thus, near the T-shaped feature 452, the shape of the cutting area 453 has been adjusted. Similar adjustments to the shapes of cutting areas have been made near other T-shaped features.

In FIG. 37, further adjustments to the shapes of the cutting areas are made to clean up outside corner features, such as the outside corner features 454, where the cutting region is reduced in area as shown at region 455, in order to fill in the potential sides of the patient window. Also, small spaces in the field of the phase shifter layer are cleaned out. Thus, the small opaque field area 456 of FIG. 36 is eliminated in the layout of FIG. 37, by extension of the phase shift region to cover it.

Figure 38:
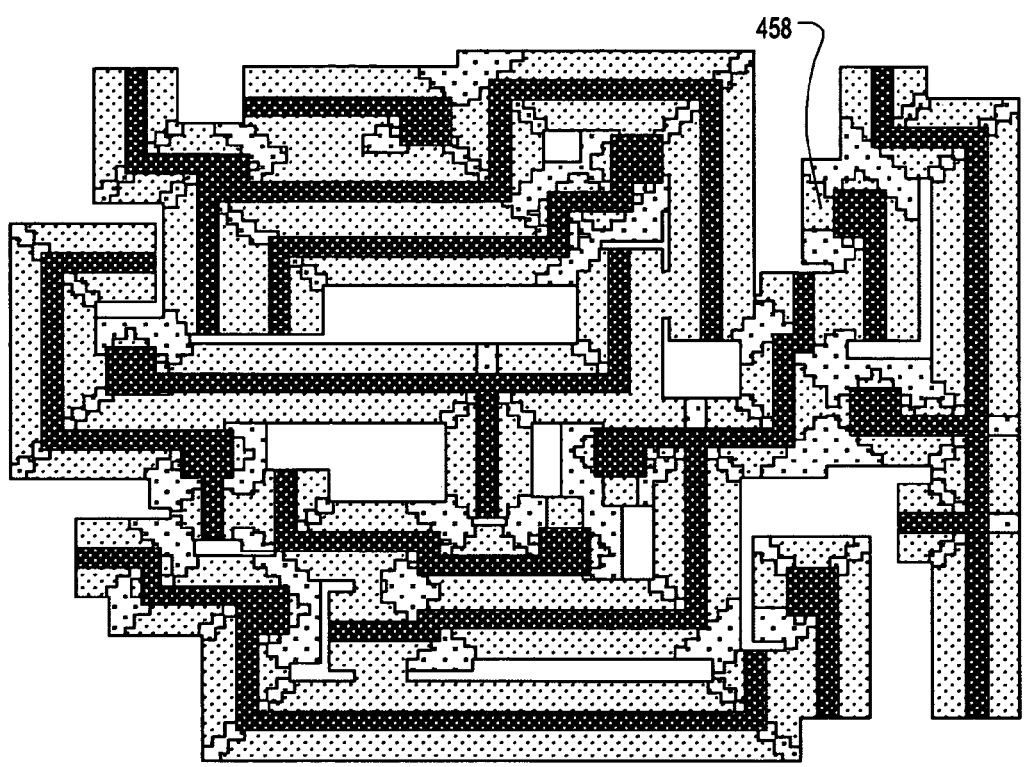
FIG. 38 illustrates the cutting areas as modified for small shifters in the pattern of FIG. 32.

In FIG. 38, the final layout of the cutting areas is shown, including isolated small shifter extensions. Thus, the small area 457 of FIG. 37 which is protected from cutting, is increased in size to establish region 458 as shown in FIG. 38. Similar adjustments are made to other small shifter regions. Adjustments are made only if the phase shift window is sufficiently isolated from other phase shift windows, so that merger of windows is avoided while the number of possible cuts is reduced.

Given a bounded number of identified cutting areas shown in yellow within the adjusted phase shift region in the layout of FIG. 38, a process of selecting cuts and assigning phase values to form phase shift windows is initiated according to present invention. One example layout is shown in FIG. 39, where zero degree phase shift regions (e.g. region 448) are identified by irregular square dot hatching, 180 degree phase shift regions (e.g region 449) are identified by diagonal cross-hatching, and the pattern is identified by generally black filler. Opaque background areas are left white in this diagram.

FIG. 40 is a diagram of a binary trim mask for use with the phase shift mask of FIG. 39. The trim mask can be produced by initially OR'ing the phase layers and the poly layer with one another. Then, sizing down by minus 0.02 μm (for 248 nm process) and then OR'ing that sized down layer with the original field poly. The resulting trim mask is smaller than phase regions, but sufficiently sized to protect against misalignment. Other embodiments of trim masks are made using attenuated binary masking, or other types of masks.

Figure 41:
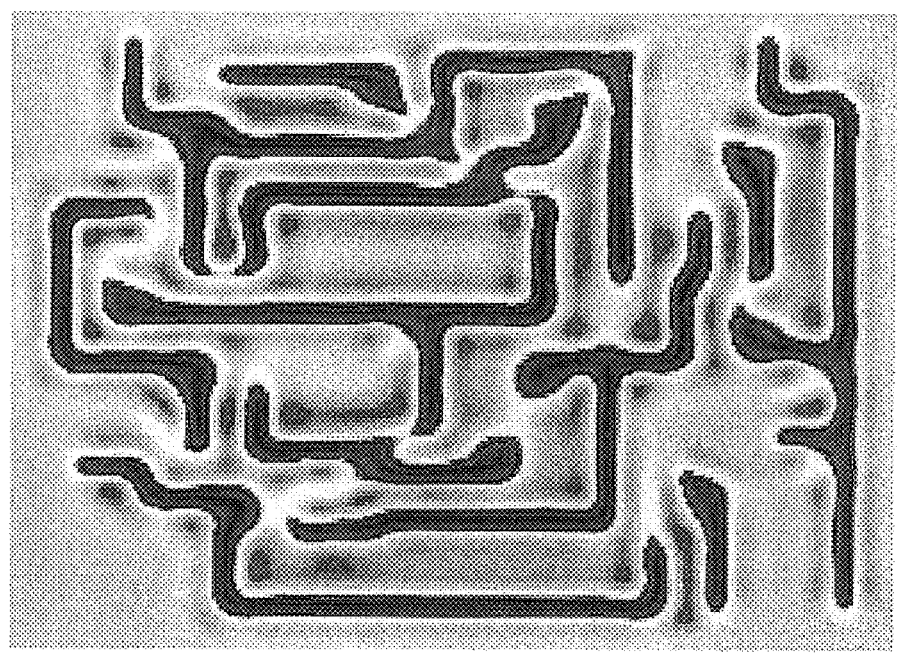
FIG. 41 illustrates a simulation of an exposure pattern using masks as shown in FIG. 39 and FIG. 40, without optical proximity correction.

FIG. 41 is a print out of a simulation of the exposure created using the mask layouts shown in FIGS. 39 and 40. As can be seen, the desired pattern is substantially formed.

FIG. 42 shows a modification of the phase shift windows of FIG. 39 after application of optical proximity correction techniques known in the art. Thus, the modified zero degree phase shift windows are identified with irregular square dot hatching, and the modified 180 degree phase shift windows are identified with diagonal cross-hatching. The simulation of the pattern exposed using the mask of FIG. 42 is shown in FIG. 43. FIG. 43 also shows a trace of the original pattern defined in the layout file. As can be seen, the exposure matches the original layout quite well.

The resulting layer in an integrated circuit according to the present invention is characterized by a dense pattern of small features formed using alternate phase shift masking. For a given wavelength of exposing radiation, the density is improved significantly by applying these techniques.

Representative prototypes of computer programs implemented using a design rule checker DRC, such as Cadence DRC tools (Assura or Vampire) available from Cadence Design Systems, San Jose, Calif., or a layout tool such as the Cadabra tool (abraCAD) available from Cadabra, a Numerical Technologies, Inc. company, San Jose, Calif., which perform the process of defining the shapes and positions of phase shift window according to the present invention operate as explained below.

The basic process flow for either prototype includes the following:

1. Create the phase layer with no cut. The shifter layer that defines phase shift regions is created by sizing the original layout by a given width (shifter width). Only the line-ends are not sized.

2. Identify the non-critical regions of the layout. For both tools, a similar methodology is used. For example using Assura, we define:

---

L1 = original poly layer definition, including the pattern to be processed.
L2 = non-critical regions of the original poly layer.
L2_1 = geomSize (L1 −0.06 edges) ;; create a layer L2_1 from the original edge location to
;; an edge location moved by 0.06 micron inside the polygons,
;; so that widths smaller than 0.12 micron disappear.
L2_2 = geomAndNot (L1 L2_1) ;; subtract L2_1 from L1.
L2 = geomSize (L2_2 0.06) ;; size L2_2 by 0.06 micron, this layer contains all the large
;; features from L1 as well as the "Ts" and elbows.

---

3. Identify critical space regions.

---

L1 = original poly layer definition.
L3 = critical space region of the original poly layer.
L3_1 = geomSize (L1 0.1 edges) ;; creates a layer L3_1 from the original edge location to
;; an edge location moved by 0.1 micron outside the
;; polygons (all spaces below 0.2 micron will be merged).
L3_2 = geomSize (L3_1 −0.05) ;;sizes down L3_1 by 0.05 micron, only bridged areas remain.
L3 = geomSize (L3_2 0.05) ;;brings bridged areas back to normal size.

---

4. Create phase-shifting regions protected from cutting, as shown in FIGS. 34–38.

5. Create possible cut regions: the difference between the phase-layer with no cut (step 1—See FIG. 32) and the phase-shifting regions (step 4—See FIG. 38) represents the areas where the cuts are allowed.

6. Assign phase values (for example 0 or 180 degrees) and decide which cut should be used: the decision on phase value assignment and on choice of cut is made using the following criteria:
   a) try to avoid the creation of small phase-shift windows that are difficult to manufacture on the mask and that do not provide sufficient process latitude.
   b) try to keep the number of cuts to a minimum and keep the cuts with the maximum process latitude. For example, cuts originating from an outside opaque (chrome) corner tend to have a better process latitude than cuts originating from an inside opaque corner. Long cuts from an original opaque feature to an original opaque feature tend have more process latitude than short cuts. Cuts from an original opaque feature to a field area tend to have more process latitude than cuts from an original opaque feature to an original opaque feature.
   c) The selection rules are used to create a cost function, according to known techniques that is minimized during the process of assigning phases and choosing cuts.

Figure 44:
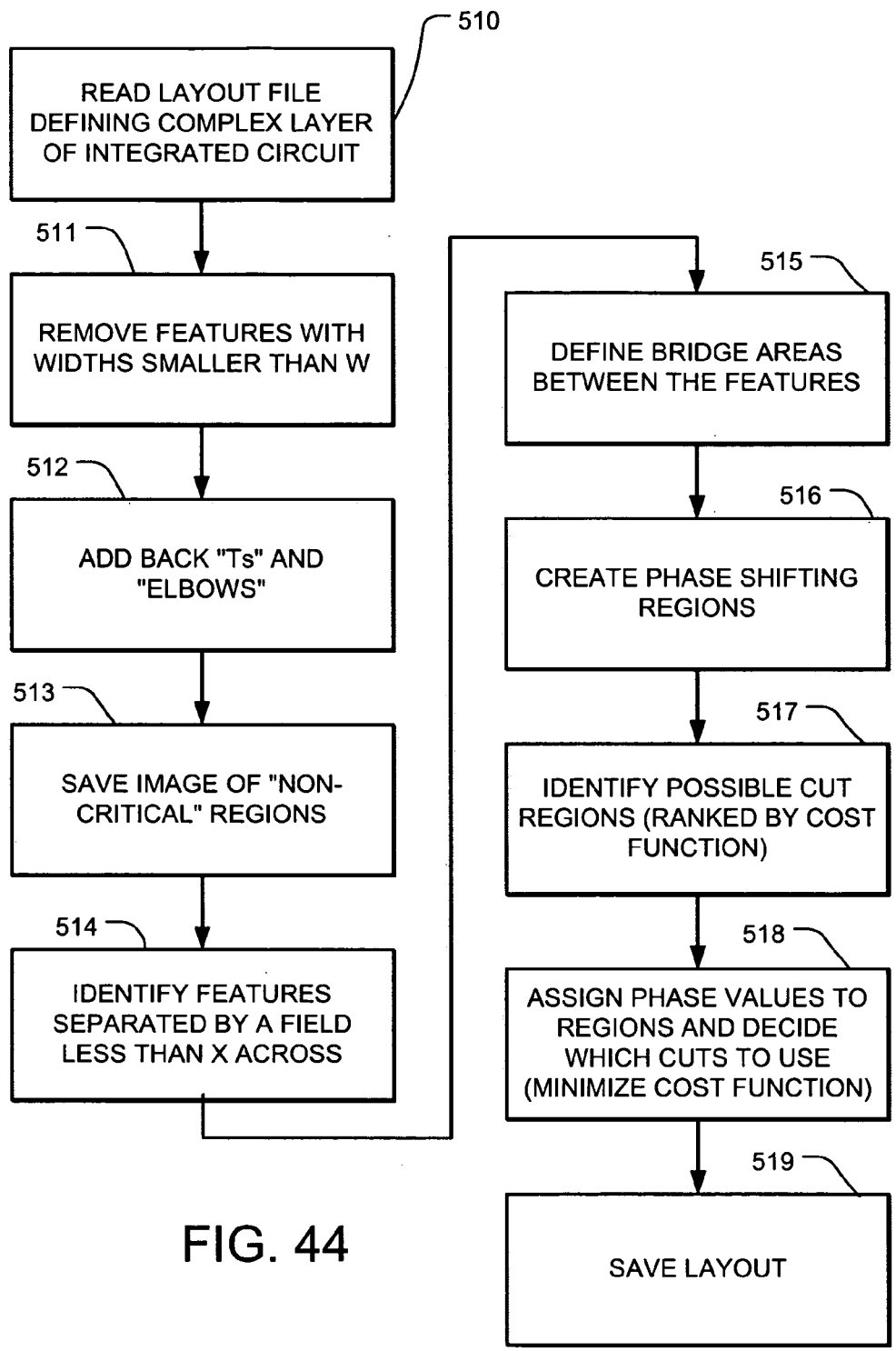
FIG. 44 is a simplified flow chart of a process for identifying cutting areas, cutting the shift regions into phase shift windows in the cutting areas, and assigning phase shift values to the phase shift windows.

FIG. 44 is a simplified flow diagram for the process of laying out phase shift windows according to one embodiment of the present invention. The process begins wit reading out a layout tile defining a complex layer including a pattern to be implemented (block 510). Features of the pattern having a width smaller than a parameter W are removed (block 511). T-shaped and elbow-shaped features are added back (Block 512). The resulting image is saved as an image of "non-critical" features (block 513). Next, features are identified that are separated by a field less than a parameter X across (block 514). "Critical" bridge areas are defined as the fields between such features (block 515). Phase shift regions are created around the pattern, from which phase shift windows will be created (block 516). Possible cut regions are identified based upon the features of the pattern outlined above, and ranked by cost function (block 517). Phase values are assigned to regions and decisions arc made as to which cuts to use while minimizing the cost function, to create the final layout of phase shift windows (block 518). The layout is saved in a computer readable medium (block 519).

Figure 45:
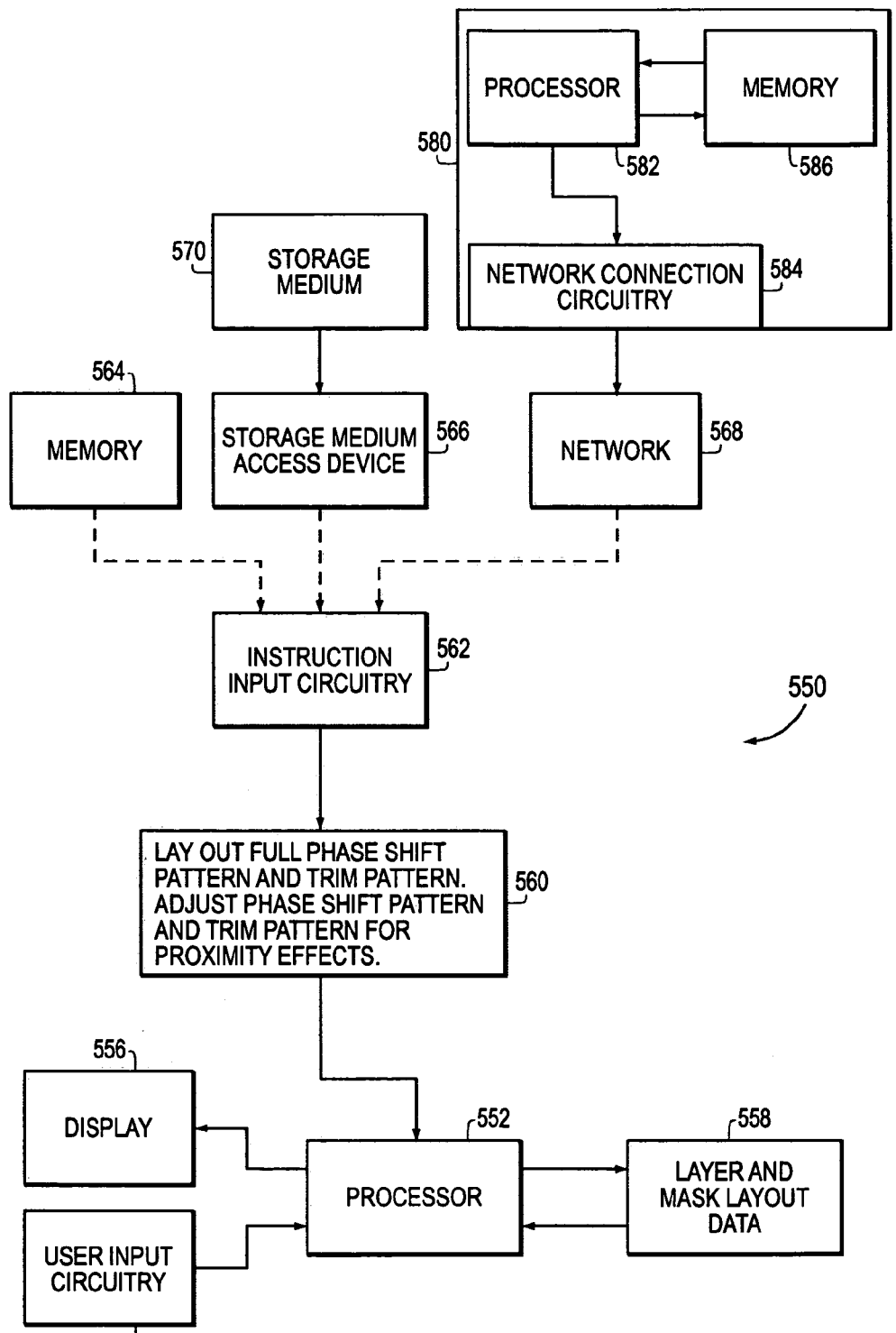
FIG. 45 is a simplified diagram of data processing system according to one example of the present invention.

The generation of phase shift masks for a complex structure is a non-trivial processing problem. FIG. 45 illustrates a data processing system for such task, representative of a wide variety of computer systems and computer architectures suitable for this application. Machine 550 in FIG. 45 includes processor 552 connected for receiving data indicating user signals from user input circuitry 554 and for providing data defining images to display 556. Processor 552 is also connected for accessing mask and layer layout data 558, which define a mask layout under construction and a layout for a layer of material to be exposed using the mask. Processor 552 is also connected for receiving instruction data 560 indicating instructions through instruction input circuitry 562, which can illustratively provide instructions received from connections to memory 564, storage medium access device 566, or network 568.

In executing the commands indicated by instruction data 560, processor 552 uses layout data 558 to provide data defining a layout for a mask, and optionally an image of the mask layout to display 556 to cause it to present a representation of the layout.

In executing the instructions indicated by instruction data 560, processor 552 also receives user signal data from user input device 554, as necessary for control of, or interaction with, the process.

As noted above, FIG. 45 illustrates three possible sources from which instruction input circuitry 562 could receive data indicating instructions: memory 564, storage medium access device 566, and network 568.

Memory 564 could be any conventional memory within machine 550, including random access memory (RAM) or read-only memory (ROM), or could be a peripheral or remote memory device of any kind.

Storage medium access device 566 could be a drive or other appropriate device or circuitry for accessing storage medium 570, which could, for example, be a magnetic medium such as a set of one or more tapes, diskettes, or floppy disks; an optical medium such as a set of one or more CD-ROMs; or any other appropriate medium for storing data. Storage medium 570 could be a part of machine 550, a part of a server or other peripheral or remote memory device, or a software product. In each of these cases, storage medium 570 is an article of manufacture that can be used in machine 550. Data units can be positioned on storage medium 570 so that storage medium access device 566 can access the data units and provide them in a sequence to processor 552 through instruction input circuitry 562. When provided in the sequence, the data units form instruction data 560, indicating instructions as illustrated.

Network 568 can provide instruction data 560 received as a communication from machine 580. Processor 582 in machine 580 can establish a connection with processor 552 over network 568 through network connection circuitry 584 and instruction input circuitry 562. Either processor could initiate the connection, and the connection could be established by any appropriate protocol. Then processor 582 can access instruction data stored in memory 586 and transfer the instruction data over network 568 to processor 552 so that processor 552 can receive instruction data 560 from network 568. Instruction data 560 can then be stored in memory 564 or elsewhere by processor 552, and can be executed.

The resulting layout data is stored in a machine readable form, or presented in a communication to a remote system.

Automatic assignment of phase for phase shift regions, and the addition of proximity correction features, including optical proximity corrections features as described above, are provided in this example to facilitate processing. Three stages in the generation of phase shift mask layouts according to the process which is implemented using a design rule checking programming language (e.g. Assura™ Design Rule Checker provided by Cadence Design Systems) in a data processing system, like that of FIG. 45, for one example, include definition of input layers, generation of output layers, and cutting and assignment of phase values to the phase shift windows.

In some embodiments, the display 556 supports depiction (and in some embodiments interaction with) one or more of the representations of the data shown generally in figures. For example, the representation of FIG. 29 where non-critical features of the pattern are marked in a distinguishing color could be presented for review and/or human modification. Similarly, the results of simulated exposures with and/or without OPC could be reviewed and possibly compared with a non-phase shifting exposure.

In some embodiments, the assignment of phase values to regions is simplified (see blocks 517–518 of FIG. 44). Specifically, for many real world designs, the assignment can be done without the ranking (see block 517 of FIG. 44) and without the minimization of a cost function (block 518). One heuristic is to assume that a cut will be made in all possible cut regions and to assign phase values accordingly.

More generally, minimization of the cost function may be computationally intractable, or simply computationally undesirable, for one or more designs. Specific implementations may chose from a number of data representations and approaches (e.g. start with no cuts vs. start with all cuts). One embodiment uses a graph representation where each phase shifter region is represented as a node and one set of edges is used to represent adjacency and another set of edges is used to represent phase restrictions, e.g. an edge indicates that the two shifter regions must be of different phase, e.g. across a feature. Feasibility can be checked in such a graph by identifying odd length cycles of phase restrictions. To find a better solution than the heuristic above, adjacent nodes can be merged (e.g. a cut removed) provided that a phase conflict is not created. If the adjacency edges (representing cutting regions) are weighted to indicate the relative cost of the cut then one approach is to attempt to merge adjacent nodes connected by the smallest (or greatest) edge weights. However, as FIG. 39 shows, some solutions may include extending or merging phase shift regions into the (opaque) field to form larger shifter regions.

The particular data representation and approach to solving the produced coloring problem may be varied to meet the computational needs and/or combined with multiple approaches. For example, the graph approach described above could be applied for a predetermined number of iterations and then, optionally, be followed by further human optimization.

Embodiments of the invention generally require two masks, the phase shifting mask and the trim mask. Because the cost of manufacturing two masks will exceed the cost of manufacturing a single mask, designers of ICs may want to carefully select which layers will be produced according to embodiments of the invention. For example, the designer might use embodiments of the invention to produce some layers while producing other layers with single-mask techniques. In one embodiment, only those layers of the IC that include patterns with a large number of densely packed, small dimension features relative to the density and size of features on other layers of a particular design are produced using the PSM approaches described herein. In other embodiments, factors considered in making the selection take into account IC yield and performance if a given layer is produced using the PSM approaches described herein.

The application of adjustments for proximity correction in complex alternating phase shift masking patterns is provided, in which adjustments are available that change or add shapes in one or both of the phase shift mask pattern and the corresponding trim mask pattern. Such adjustments are available for layouts in which phase assignment is executed automatically, and in which complex shapes, including shapes including intersecting lines.

The foregoing description of various embodiments of the invention have been presented for purposes of illustration and description. The description is not intended to limit the invention to the precise forms disclosed. Many modifications and equivalent arrangements will be apparent to people skilled in the art.

What is claimed is:

1. A method of designing masks for making integrated circuits with phase shifting, comprising:

identifying a pattern for a layer to be formed using photolithography, the pattern including a plurality of intersecting line segments defining intersections with a plurality of inside corners; and laying out a phase shift mask, including:
  laying out phase shift regions for the identified pattern extending adjacent to line segments in the plurality of intersecting line segments, the phase shift regions stopping short of inside corners of the plurality of inside corners; and
  laying out an opaque field extending into the inside corners of the plurality of inside corners; and
laying out a complementary mask including a plurality of opaque features preventing exposure or the plurality of intersecting line segments to be exposed using the phase shift mask.

2. The method of claim 1 wherein at least one of the phase shift regions stops short of at least one or the inside corners such that said phase shift region extends to within a particular distance of said inside corner, and said laying out the opaque field includes extending at least part of the opaque field by about the particular distance from said inside corner.

3. The method of claim 1 wherein portions of the opaque field extending into the inside corners are rectangular.

4. The method of claim 1 wherein said laying out the phase shift mask includes assigning opposite phases to phase shift regions separated by one of the inside corners.

5. The method of claim 1 wherein said Laying out the phase shift mask includes assigning same phases to phase shift regions separated by one of the inside corners.

6. The method of claim 1 wherein said laying out the phase shift mask includes reshaping the phase shift regions.

7. The method of claim 1 wherein the phase shift regions stop short of all inside corners of the plurality of inside corners, and the opaque field extends into all inside corners of the plurality of inside corners.

8. The method of claim 1 wherein the phase shift regions stop short of each inside corner of the plurality of inside corners where a shape of said inside corner is not critical, and the opaque field extends into each inside corner of the plurality of inside earners where the shape of said inside corner is not critical.

9. The method of claim 1 wherein said laying out the phase shift mask includes assigning phases to the phase shift regions, and the phase shift regions stopping short of inside corners of the plurality of inside corners include phase shift regions associated with a phase mismatch.

10. A method of designing masks for making integrated circuits with phase shifting, comprising:
  identifying a pattern for a layer to be formed using photolithography, the pattern including a plurality of intersecting line segments defining intersections with a plurality of inside corners; and
  laying out a phase shift mask, including:
    laying out phase shift regions for the identified pattern extending adjacent to line segments in the plurality of intersecting line segments, the phase shift regions stopping short of inside corners of the plurality of inside corners; and
    laying out an opaque field extending into the inside corners of the plurality of inside corners.

11. The method of claim 10 wherein at least one of the phase shift regions stops short of at least one of the inside corners such that said phase shift region extends to within a particular distance of said inside corner, and said laying out the opaque field includes extending at least part of the opaque field by about the particular distance from said inside corner.

12. The method of claim 10 wherein portions of the opaque field extending into the inside corners are rectangular.

13. The method of claim 10 wherein said laying out the phase shift mask includes assigning opposite phases to phase shift regions separated by one of the inside corners.

14. The method of claim 10 wherein said laying out the phase shift mask includes assigning same phases to phase shift regions separated by one of the inside corners.

15. The method of claim 10 wherein said laying out the phase shift mask includes reshaping the phase shift regions.

16. The method of claim 10 wherein the phase shift regions stop short of all inside corners of the plurality or inside corners, and the opaque field extends into all inside corners of the plurality of inside corners.

17. The method of claim 10 wherein the phase shift regions stop short of each inside corner of the plurality of inside corners where a shape of said inside corner is not critical, and the opaque field extends into each inside corner of the plurality of inside corners where the shape of said inside corner is not critical.

18. The method or claim 10 wherein said laying out the phase shift mask includes assigning phases to the phase shift regions, and the phase shift regions stopping short of inside corners of the plurality of inside corners include phase shift regions associated with a phase mismatch.

19. A method of designing masks for making integrated circuits with phase shifting, comprising:
  identifying a pattern for a layer to be formed using photolithography, the pattern including a plurality of intersecting line segments defining intersections with a plurality of inside corners; and
  laying out a phase shift mask, including:
    laying out, in an opaque field, phase shift regions for the identified pattern extending adjacent to line segments in the plurality of intersecting line segments and around the plurality of inside corners; and
    dividing the phase shift regions by extending the opaque field into portions of the phase shift regions at the plurality or inside corners; and
  laying out a complementary mask including a plurality of opaque features preventing exposure of the plurality of intersecting line segments to be exposed using the phase shift mask.

20. The method of claim 19 wherein portions of the opaque field extending at the inside corners are rectangular.

21. The method of claim 19 wherein said laying out the phase shift mask includes assigning opposite phases to divided phase shift regions.

22. The method of claim 19 wherein said laying out the phase shift mask includes assigning same phases to divided phase shift regions.

23. The method of claim 19 wherein said laying out the phase shift mask includes reshaping said divided phase shift regions.

24. The method of claim 19 wherein said dividing includes dividing phase shift regions at all inside corners of the plurality of inside corners.

25. The method of claim 19 wherein said dividing includes dividing phase shift regions at each inside corner of the plurality of inside corners where a shape or said inside corner is not critical.

26. The method of claim 19 wherein said laying out the phase shift mask includes assigning phases to divided phase shift regions, and said dividing includes dividing phase shift regions associated with a phase mismatch.

27. A method of designing masks for making integrated circuits with phase shifting, comprising:
  identifying a pattern for a layer to be formed using photolithography, the pattern including a plurality of intersecting line segments defining intersections with a plurality of inside corners; and laying out a phase shift mask, including:

laying out, in an opaque field, phase shift regions for the identified pattern extending adjacent to line segments in the plurality of intersecting line segments and around the plurality of inside corners; and dividing the phase shift regions by extending the opaque field into portions of the phase shift regions at the plurality of inside corners.

28. The method of claim 27 wherein portions of the opaque field extending at the inside corners are rectangular.

29. The method of claim 27 wherein said laying out the phase shift mask includes assigning opposite phases to divided phase shift regions.

30. The method of claim 27 wherein said laying out the phase shift mask includes assigning same phases to divided phase shift regions.

31. The method of claim 27 wherein said laying out the phase shift mask includes reshaping said divided phase shift regions.

32. The method of claim 27 wherein said dividing includes dividing phase shift regions at all inside corners of the plurality of inside corners.

33. The method of claim 27 wherein said dividing includes dividing phase shift regions at each inside corner of the plurality or inside corners where a shape of said inside corner is not critical.

34. The method of claim 27 wherein said laying out the phase shift mask includes assigning phases to divided phase shift regions, and said dividing includes dividing phase shift regions associated with a phase mismatch.

* * * * *